(12) United States Patent
Nagaishi et al.

(10) Patent No.: US 7,804,443 B2
(45) Date of Patent: Sep. 28, 2010

(54) MILLIMETER WAVEBAND TRANSCEIVER, RADAR AND VEHICLE USING THE SAME

(75) Inventors: Hideyuki Nagaishi, Hachioji (JP); Hiroshi Shinoda, Kodaira (JP); Kazuo Matsuura, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 156 days.

(21) Appl. No.: 11/934,705

(22) Filed: Nov. 2, 2007

(65) Prior Publication Data
US 2008/0129408 A1    Jun. 5, 2008

(30) Foreign Application Priority Data
Nov. 30, 2006  (JP) .............. 2006-323783

(51) Int. Cl.
*G01S 13/00* (2006.01)
*H01Q 13/00* (2006.01)
*H03H 7/38* (2006.01)
*H01P 1/00* (2006.01)

(52) U.S. Cl. ............... 342/70; 343/772; 333/32; 333/33; 333/247; 333/248

(58) Field of Classification Search ............ 342/70–72, 342/175; 343/711, 713, 762, 772; 333/26, 333/33, 247, 248
See application file for complete search history.

(56) References Cited

U.S. PATENT DOCUMENTS 2,877,429 A * 3/1959 Sommers et al. .......... 333/24 R
3,697,902 A * 10/1972 Louvel ..................... 333/246
3,969,691 A * 7/1976 Saul ......................... 333/21 R
4,453,142 A * 6/1984 Murphy .................... 333/26

(Continued)

FOREIGN PATENT DOCUMENTS

DE          44 41 073        1/1996

(Continued)

OTHER PUBLICATIONS

A Compact Manufacturable 76-77-GHz Radar Module for Commercial ACC Applications, IEEE Transactions on Microwave Theory and Techniques, Jan. 2001, pp. 44-58, vol. 49, No. 1, IEEE Services Center, Piscatawav, N J, USA.*

(Continued)

*Primary Examiner*—Thomas H Tarcza
*Assistant Examiner*—Peter M Bythrow
(74) *Attorney, Agent, or Firm*—Miles & Stockbridge P.C.

(57) ABSTRACT

In a millimeter waveband transceiver using an antenna and a waveguide for a connection line, it is necessary to perform transmission mode line conversion between TEM waves of a microstrip line and VTE01 mode waves of the waveguide. There is a limit to reducing the conversion loss using only a matching box for connecting the microstrip line with the waveguide. In a transmission mode line transducer for converting between the TEM waves of the microstrip line and the VTE01 mode waves of the waveguide, if the cross-sections are substantially the same size, in the case of a 50Ω microstrip line when the characteristic impedance of the waveguide is about 80%, i.e., 40Ω, the line conversion loss can be optimized. Therefore, the microstrip line is connected with the waveguide using a λ/4 matching box via a ridged waveguide having a low impedance and a length of λ/16 or less.

20 Claims, 27 Drawing Sheets

U.S. PATENT DOCUMENTS

| | | | | |
|---|---|---|---|---|
| 4,675,623 | A * | 6/1987 | Nowak et al. | 333/26 |
| 4,973,925 | A * | 11/1990 | Nusair et al. | 333/26 |
| 5,361,049 | A * | 11/1994 | Rubin et al. | 333/26 |
| 5,414,394 | A * | 5/1995 | Gamand et al. | 333/26 |
| 5,726,664 | A * | 3/1998 | Park et al. | 343/705 |
| 5,793,263 | A * | 8/1998 | Pozar | 333/26 |
| 5,867,073 | A * | 2/1999 | Weinreb et al. | 333/26 |
| 5,912,598 | A * | 6/1999 | Stones et al. | 333/26 |
| 5,982,250 | A * | 11/1999 | Hung et al. | 333/26 |
| 6,060,959 | A * | 5/2000 | Yakuwa | 333/26 |
| 6,127,901 | A * | 10/2000 | Lynch | 333/26 |
| 6,239,669 | B1 * | 5/2001 | Koriyama et al. | 333/26 |
| 6,396,363 | B1 * | 5/2002 | Alexanian et al. | 333/26 |
| 6,639,484 | B2 * | 10/2003 | Tzuang et al. | 333/21 R |
| 6,794,950 | B2 * | 9/2004 | du Toit et al. | 333/21 R |
| 6,822,528 | B2 * | 11/2004 | Dawn et al. | 333/26 |
| 6,958,662 | B1 * | 10/2005 | Salmela et al. | 333/26 |
| 7,068,121 | B2 * | 6/2006 | Ding et al. | 333/26 |
| 7,095,292 | B2 * | 8/2006 | Sayanagi et al. | 333/26 |
| 7,102,458 | B2 * | 9/2006 | Koriyama et al. | 333/26 |
| 7,148,765 | B2 * | 12/2006 | Tahara et al. | 333/26 |
| 7,276,987 | B2 * | 10/2007 | Koriyama | 333/26 |
| 7,680,464 | B2 * | 3/2010 | Pleva et al. | 455/81 |
| 2002/0097108 | A1 * | 7/2002 | Jain | 333/26 |
| 2002/0097109 | A1 * | 7/2002 | du Toit et al. | 333/26 |
| 2005/0017818 | A1 * | 1/2005 | Kinayman et al. | 333/33 |
| 2007/0085626 | A1 * | 4/2007 | Lee et al. | 333/26 |
| 2008/0129408 | A1 * | 6/2008 | Nagaishi et al. | 333/33 |

FOREIGN PATENT DOCUMENTS

| | | |
|---|---|---|
| EP | 1 592 081 A1 | 11/2005 |
| JP | 7-202524 A | 8/1995 |
| JP | 2000-216605 A | 8/2000 |
| JP | 2002-208807 A | 7/2002 |
| WO | WO 02/33782 A1 | 4/2002 |

OTHER PUBLICATIONS

Gresham et al., A Compact Manufacturable 76-77-GHz Radar Module for Commercial ACC Applications, IEEE Transactions on Microwave Theory and Techniques, Jan. 2001, pp. 44-58, vol. 49, No. 1, IEEE Services Center, Piscataway, NJ, USA.

Japanese Office Action dated Jan. 6, 2009 received in Japanese App. No. 2006-323806, and English language translation thereof.

Japanese Office Action dated Apr. 2, 2009 received in Japanese App. No. 2006-323806, and English language translation thereof.

* cited by examiner (PRIOR ART)

MILLIMETER WAVEBAND TRANSCEIVER, RADAR AND VEHICLE USING THE SAME

CLAIM OF PRIORITY

The present invention claims priority from Japanese application JP 2006-323783 filed on Nov. 30, 2006, the content of which is hereby incorporated by reference into this application.

FIELD OF THE INVENTION

The present invention relates to a millimeter waveband transceiver using a microstrip line and waveguide as a transmission line, a radar, and a vehicle using the same.

BACKGROUND OF THE RELATED ART

Japanese Patent Application Laid-Open Publication No. 2002-208807 and Japanese Patent Application Laid-Open Publication No. 2000-216605 disclose an example of a line transducer (a line transition element) that performs conversion between a microstrip line and a waveguide. FIG. 24 shows a first embodiment, and FIG. 25 shows a second embodiment, of Japanese Patent Application Laid-Open Publication No. 2002-208807. In this conventional technology, a microstrip line 210 and an external waveguide 212 are connected via a dielectric ridged waveguide 211. The line transducer in FIG. 24 includes a multilayer dielectric substrate 201b laminated on an external waveguide 212, a dielectric substrate 201a laminated above this, a ground conductor pattern 202 laminated on the undersurface of the dielectric substrate 201a, a strip conductor pattern 203 laminated on the top surface of the dielectric substrate 201a, waveguide-forming conductor patterns 204a, 204b provided on each surface of the multilayer conductor substrate 201b, ridge-forming conductor patterns 205a, 205b, aground conductor pattern gap 206 provided on the ground conductor pattern 202, a conductor pattern gap 207 provided on the waveguide-forming conductor pattern 204b, and, a waveguide-forming via 208 and a ridge-forming via 209. The strip conductor pattern 203 and ground conductor pattern 202 disposed on the top and bottom of the dielectric substrate 201a form the microstrip line 210. The dielectric substrate 201a, multilayer dielectric substrate 201b, ground conductor pattern 202, waveguide-forming conductor patterns 204a, 204b, ridge-forming conductor patterns 205a, 205b, and waveguide-forming via 208 and ridge-forming via 209, form the dielectric ridged waveguide 211.

The line transducer of FIG. 25 includes ridge-forming vias 209a, 209b, these ridge-forming vias 209a, 209b forming the dielectric ridged waveguide 211, and functioning as a two-step impedance transformer.

In the example disclosed in Japanese Patent Application Laid-Open Publication No. 2000-216605, a line transducer between a microstrip line (radio-frequency line conductor) and the waveguide is a "ridged waveguide" formed in a step-like shape wherein a connecting line conductor is disposed parallel in the same transmission direction as that of the microstrip line, and the gap between upper and lower main conductor layers in the waveguide line of the connecting part is made narrow.

SUMMARY OF THE INVENTION

The standard waveguide which is designed from the viewpoint of suppressing conductor loss has a characteristic impedance of several hundred Ω. In order to directly connect with the standard waveguide, it will be assumed that the characteristic impedance of an external waveguide (e.g., the external waveguide 212 in FIG. 24) is equal to the characteristic impedance of the standard waveguide such that the reflection loss is low. On the other hand, matching with the IC in the measurement system or the RF (Radio Frequency) circuit is taken into consideration, the characteristic impedance of a microstrip line is often designed to be 50Ω. To connect a transmission line of such different characteristic impedance, a λ/4 transducer is used.

When a transmission line having a characteristic impedance of $Z_1$ is connected to a transmission line having a characteristic impedance of $Z_2$, the λ/4 transducer is a line of length λ/4 having a characteristic impedance of $Z_3$ ($:Z_3=\sqrt{(Z_1*Z_2)}$). The magnitude relationship between the characteristic impedances is given by inequality (1):

$$Z_2 < Z_3 < Z_1 \quad (1)$$

In the example of Japanese Patent Application Laid-Open Publication No. 2002-208807, it is seen that if the characteristic impedance of the external waveguide 212 is $Z_1$ and the characteristic impedance of the microstrip line 210 is $Z_2$, the characteristic impedance of the dielectric ridged waveguide 211 is $Z_3$, which is an intermediate value between $Z_1$ and $Z_2$. As a means of decreasing the characteristic impedance of the dielectric ridged waveguide 211 to less than that of the external waveguide, the shortest side of the rectangular cross-section of the waveguide can simply be shortened, but since a ridged waveguide having a transmission mode approximating that of the microstrip line is ideal, this is what is used in the conventional technology.

However, if the characteristic impedance ratio between the external waveguide 212 and microstrip line 210 is large, the reflection loss increases, and it is difficult to suppress the line transition loss to a minimum. In the example of Japanese Patent Application Laid-Open Publication No. 2002-208807, in order to resolve this problem, the lengths of the ridge-forming vias 209a, 209b forming the dielectric ridged waveguide 211 are respectively arranged to be λ/4, and the dielectric ridged waveguide 211 is split as shown in FIG. 25. Thus, plural dielectric ridged waveguides having different characteristics impedances were disposed in columns between the external waveguide 212 and microstrip line 210, and by suppressing the characteristic impedance ratio, the line transition loss is suppressed.

Micro/millimeter waveband transceivers are increasingly being used as radio-frequency transceiver modules for vehicle-mounted radar and inter-vehicle communications. In the communications field, particular interest is being shown as regards the communications capacity and communications reliability of the millimeter waveband, so low-cost transceivers modules are now desired.

Due to the diversity of millimeter waveband transceivers, the cost of transceivers is continually reduced by separating universal RF circuits and antennas, and meeting design specifications with combinations of RF circuits and antennas. The separation of RF circuits and antennas requires millimeter waveband transmission lines to connect them, and various types of transmission lines can be used in the millimeter waveband such as coaxial lines, waveguides, parallel plates, microstrip lines and coplanar lines. Among these, waveguides are the most suitable transmission lines since they have a relatively large line cross-sectional shape, and can be designed to be robust against assembly machining error.

In using waveguides with these advantages for RF circuit-antenna connections, one problem is that of reducing the line loss due to the conversion of characteristic impedances and transmission modes between the microstrip lines and the waveguides.

For example, in millimeter waveband transceivers using an antenna and a waveguide for the connecting line, since the IC mounting section has a circuit designed for a microstrip line, a transmission mode line conversion must be performed between the TEM waves of the microstrip line and the VTE01 mode waves of the waveguide. In the conventional technology, characteristic impedance matching between these lines is achieved using a λ/4 matching box, which is a millimeter waveband impedance matching means, to reduce the assembly loss. Another technique is also known, as shown in FIG. 25, where a line transducer is formed by using plural λ/4 transducers to reduce the reflection loss.

FIG. 13 shows the reflection loss of a line transducer using an ordinary λ/4 transducer. Here, a low impedance waveguide and a 380Ω standard waveguide are connected using a λ/4 transducer. The diagram shows the results of a simulation using four characteristic impedances, i.e., 40Ω, 108Ω, 158Ω, and 203Ω. It is seen that for a connection with a 203Ω waveguide having a characteristic impedance ratio of about 2, the reflection loss is −34 dB, and with 40Ω having a characteristic impedance ratio of about 9, the reflection loss worsens to −11 dB. For example, for a 50Ω microstrip line with a 380Ω standard waveguide, since the characteristic impedance ratio is about 8, the characteristic impedance ratio must be reduced by using two or more λ/4 transducers having a characteristic impedance ratio of about 3≈380/108 to keep the reflection loss at −20 dB or below. If $Z_1 \approx 3*Z_2$, the characteristic impedance of the λ/4 transducer is given by equation (2):

$$Z3 = \sqrt{Z1 \times Z2} = \sqrt{3} \cdot Z2 \qquad (2)$$

Therefore, the characteristic impedance of the λ/4 transducer which is first connected to the microstrip line, is that of an 86Ω waveguide having a characteristic impedance of √3 times 50Ω, i.e., 86Ω.

Hence, for a transmission line connection between a microstrip line and a waveguide, there is a limit to the loss reduction which can be achieved using only a λ/4 matching box, and this is not sufficient to satisfy the specification requirements for a millimeter waveband transceiver.

In a vehicle-mounted radar for near distance radar and long-distance radar, or in a system for transmitting and receiving signals between vehicles and public communications networks, it is required to increase communications bandwidth, further reduce radiation loss, and develop low-cost millimeter waveband transceivers or vehicle mounted radars which can be used in various environments.

It is therefore an object of the present invention to provide, in a line transducer between a microstrip line and a waveguide, a millimeter waveband transceiver that can reduce the line transition loss arising due to transmission mode conversion between microstrip line TEM waves and waveguide VTE01 mode waves, and a radar and a vehicle using the same.

A typical example of the invention will now be described. Specifically, the millimeter waveband transceiver of the invention comprising: a microstrip line; a standard waveguide; and a transmission mode transducer provided therebetween, wherein the transmission mode transducer comprising a waveguide transducer, and the characteristic impedance of the waveguide transducer is equal to or less than the characteristic impedance of the microstrip line.

According to the present invention, in the line transducer between the microstrip line and the waveguide, the loss arising due to transmission mode conversion between microstrip line TEM waves and waveguide TM01 waves can be reduced.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF THE PREFERRED EMBODIMENTS

Figure 1:
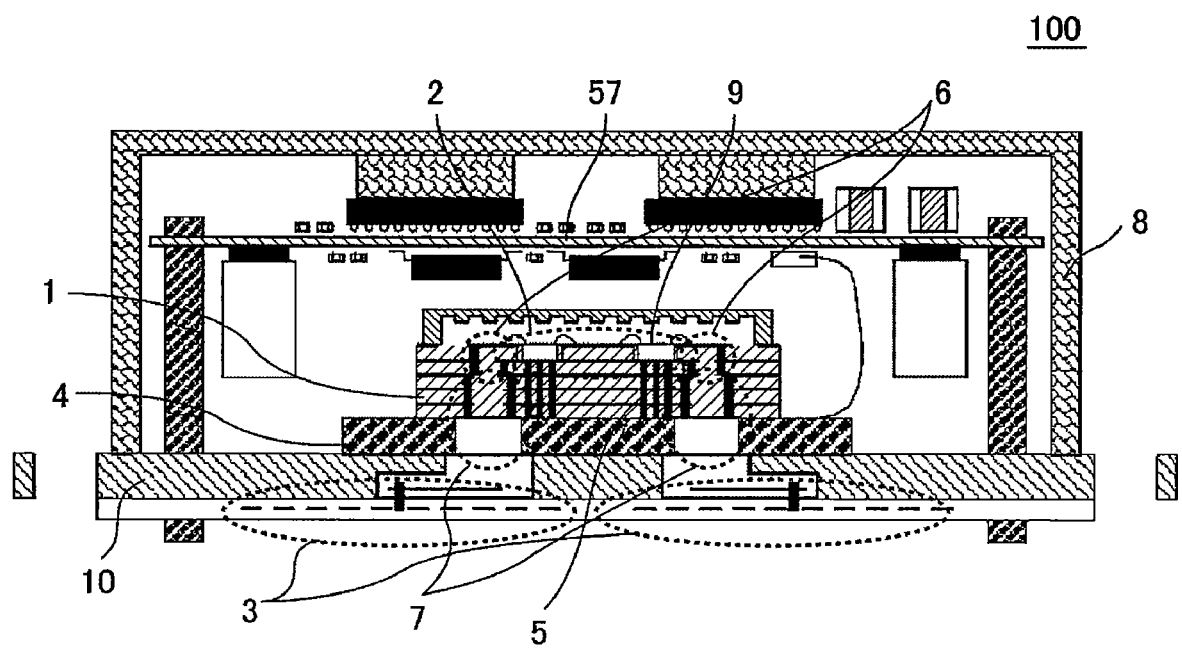
FIG. 1 is a vertical cross-section showing a first embodiment of a millimeter waveband transceiver according to the invention.

According to a representative embodiment of the invention, in line conversion between a microstrip line and a waveguide, a loss arising due to transmission mode conversion between TEM waves of the microstrip line and the waveguide TM01 waves is reduced by interposing a transmission mode transducer having a ridged waveguide section with a lower impedance than that of the microstrip line. In other words, we have discovered that in transmission mode line conversion between the TEM waves of the microstrip line and the TE01 of the waveguide, if the cross-sections are substantially the same size, the electromagnetic wave distribution of the TEM waves of the microstrip line and the electromagnetic wave distribution of the VTE01 mode waves around the ridges of the ridged waveguide become equivalent, and the line conversion loss then becomes smaller.

The microstrip line is open on its main line side upper surface. Since the circumference of the ridged waveguide is shielded with metal, the capacitance component in the rectangular part of the waveguide cross-section, except around the ridges, causes the impedance to drop when the cut-off frequency of the waveguide is reduced. Therefore, to connect the microstrip line with the waveguide, the transmission mode line conversion loss is reduced by interposing the low impedance ridged waveguide, and by making the connection using a λ/4 matching box.

Hereafter, suitable embodiments of the invention will be described in detail referring to the drawings.

First Embodiment

FIG. 1 to FIG. 7 show a first embodiment of a millimeter waveband transceiver 100 according to the invention.

FIG. 1 is a vertical section showing a first embodiment of the millimeter waveband transceiver 100 for a radar according to the invention. The millimeter waveband transceiver 100 of this embodiment includes at least a multilayer substrate 1, an RF circuit 2, plural antennas 3, a heat transfer plate 4, heat radiation vias 5, the vertical transducers 6, λ/4 matching boxes 7, a case 8, active elements 9 in the RF circuit 2, an antenna holding plate 10 and a circuit control board 57. The vertical transducer 6 that connects the RF circuit 2 with the antennas 3, is a transmission mode transducer connecting the microstrip line with a waveguide transducer at right angles. In this embodiment, the λ/4 matching box having a characteristic impedance ratio of 3 or less is provided between the input and output terminals of at least one or more of the multilayer substrate 1, the heat transfer plate 4 and the antenna holding plate 10, and the vertical transducers 6 are connected with the waveguides of the input/output terminals connected to the antennas by the plural λ/4 matching boxes.

Figure 2:
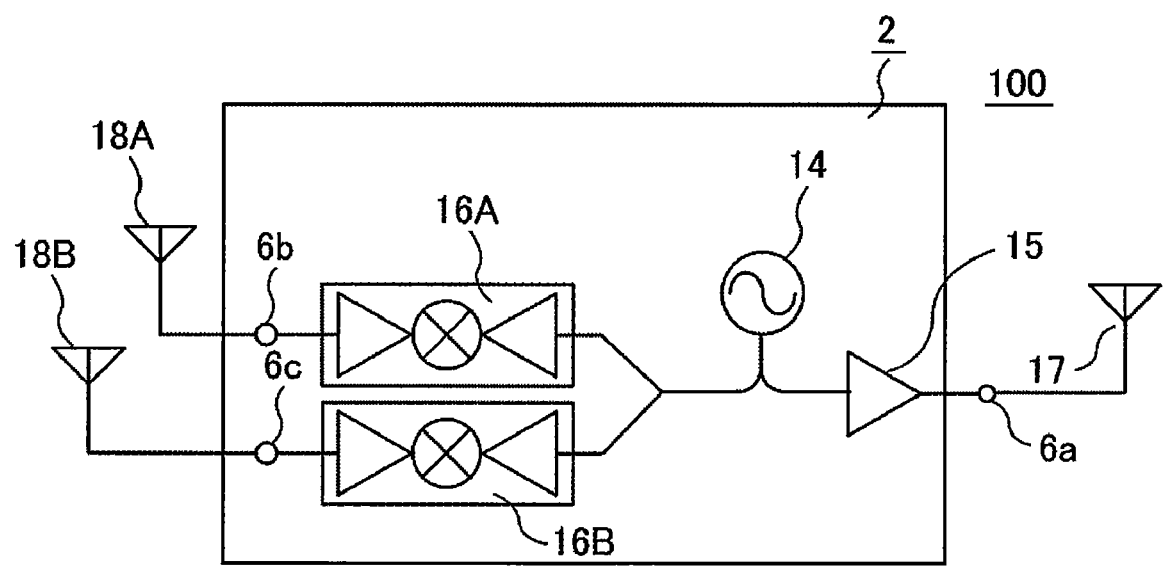
FIG. 2 is an example of a circuit diagram of a millimeter waveband transceiver for a radar according to the first embodiment of the invention.

FIG. 2 shows an example of a circuit diagram of the millimeter waveband transceiver 100 for a radar. The millimeter waveband transceiver 100 for a radar has an RF circuit including an oscillator (for example, a voltage control oscillator) 14 formed for example in the active element 9 which is a semiconductor, a power amplifier 15, and receivers 16 (16A, 16B), and also has a transmitting antenna 17 and receiving antennas 18 (18A, 18B) as the antenna 3 that send and receive radio waves. The millimeter waveband transceiver 100 for a radar amplifies a millimeter wave signal generated by the oscillator 14 to a desired power by the power amplifier 15 in order to actively perform observation, emits radio waves from the transmitting antenna 17, and receives radio waves reflected from an obstacle by the receiving antennas 18, and an IF signal containing a Doppler signal from the object is generated and output by a receive signal processing unit (not shown) of the receivers 16. The RF circuit, transmitting antenna 17, and receiving antenna 18 of the millimeter waveband transceiver 100 for a radar are connected via vertical conversion devices 6a, 6b, and 6c, respectively. As the radar modulation method for performing distance measurement, a pulse modulation mode, a FMCW (Frequency Modulated Continuous Wave) mode, a two-frequency CW, or a method which enhances these modes, may be used. In a phase comparison monopulse system for performing angle detection, a target's azimuth is measured by detecting the target's direction using the phase difference between receive signals with two receiving antennas, and detecting the phase difference $\Delta\phi$ between the receive signals when both receiving antennas receive a reflected wave from the target which is at an angle $\theta$ with respect to the normal direction of the antenna surface.

Figure 3:
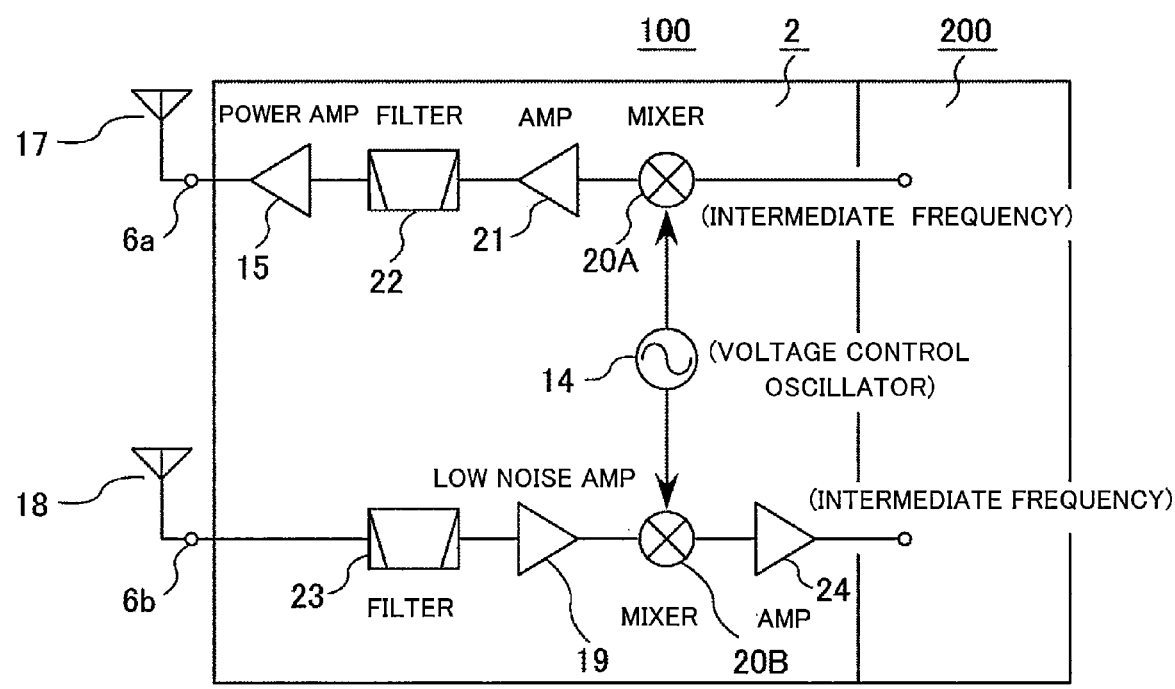
FIG. 3 is another example of a circuit diagram of the millimeter waveband transceiver for a radar according to the first embodiment.

As an example of another circuit of the millimeter waveband transceiver 100, FIG. 3 shows a millimeter waveband transceiver 100 for performing communication by TDMA (Time Division Multiple Access). The millimeter waveband transceiver 100 for performing communication is provided with the RF circuit 2 including the oscillator (for example, the voltage control oscillator) 14, power amplifier 15, a low noise amplifier 19, and a mixer 20, and the transmitting antenna 17, receiving antenna 18 and a baseband circuit section 200. The baseband circuit section 200 has a transmit signal generating function, and a receive signal processing function. The RF circuit of the millimeter waveband transceiver 100, antenna 17, and receiving antenna 18 are connected via the vertical transducers 6a, 6b, respectively. The millimeter waveband carrier wave signal generated by the oscillator 14 is mixed with an IF signal containing data by the mixer 20, amplified to a desired power by the power amplifier 15, and transmitted from the transmitting antenna 17. The receive signal acquired by the receiving antenna 18 is amplified by the low noise amplifier 19 so that the receive signal does not deteriorate due to the NF of the mixer 20, the difference from the millimeter waveband carrier wave signal is acquired by the mixer 20, and the IF signal is extracted.

The RF circuit 2 of the millimeter waveband transceiver for radar of FIG. 2 and the millimeter waveband transceiver for communication of FIG. 3 differ in their construction, however the assembly of the millimeter waveband transceiver is the same. In these transceivers, the millimeter waveband signal output from the power amplifier 15 in the RF circuit 2 passes through one of the vertical transducers 6 and λ/4 matching boxes 7, is connected with the waveguide input terminal of the antenna 3, and radiated into space from the antenna 3. On the other hand, the millimeter wave signal received from the another antenna 3, passes through the λ/4 matching box 7 and vertical transducer 6 from the waveguide output terminal of the antenna 3, is connected to the receiver 16 or low noise amplifier 19 of the RF circuit 2, and is outputted as an IF signal.

In this embodiment, to combine antennas having various characteristic radiating patterns according to the design specification of the millimeter waveband transceiver 100, standard waveguides 32 are used for the antenna connection line. The RF circuit 2 and antenna 3 are superimposed on each other in the vertical direction so that the length of the connection line is the shortest possible. The constitution of a connection line by the vertical transducer 6 and λ/4 matching box in FIG. 1, is a characteristic feature of the construction according to this embodiment.

Figure 4:
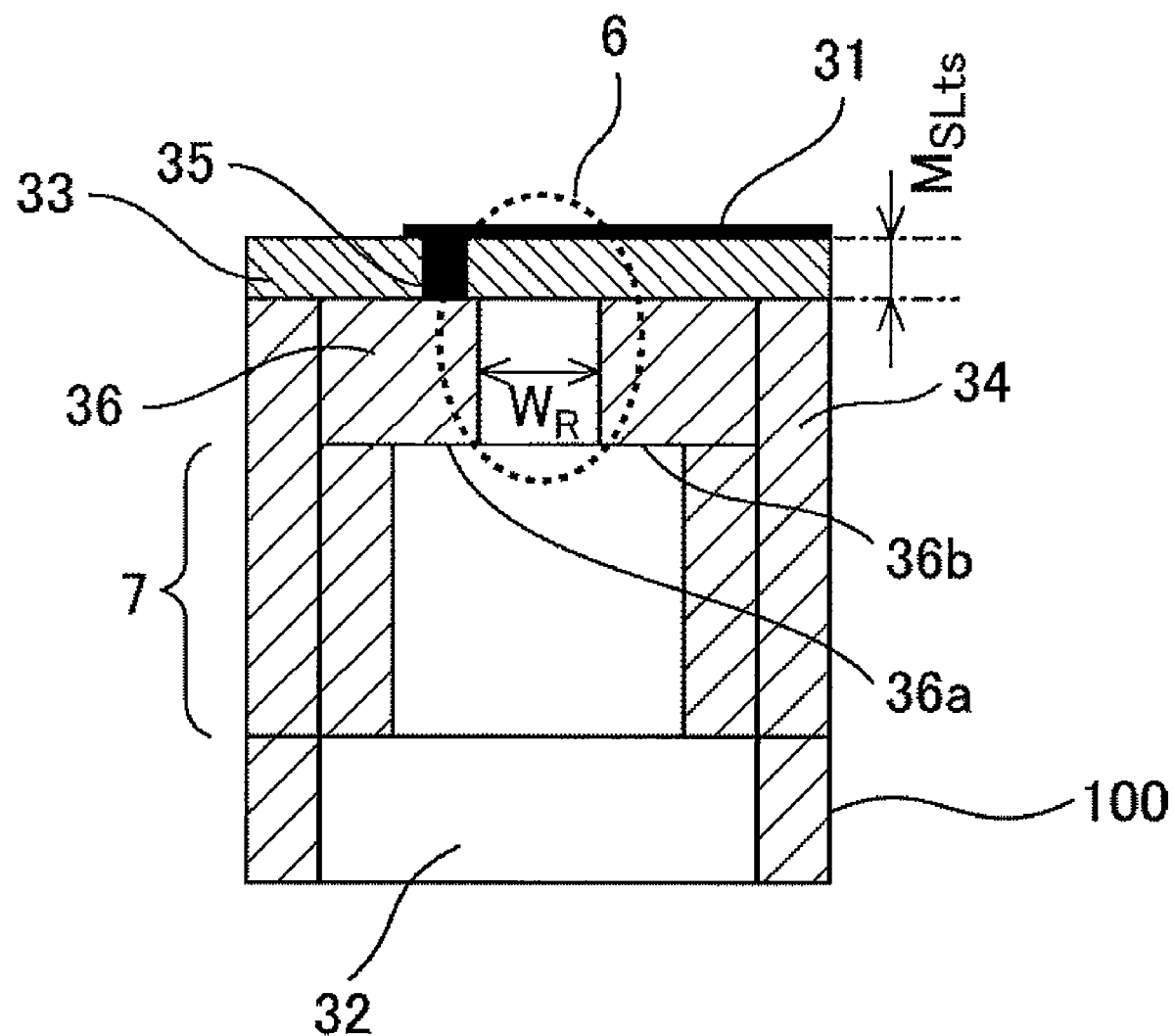
FIG. 4 is a vertical cross-section showing an example of the construction of a line transducer portion of a microstrip line and a waveguide in the millimeter waveband transceiver according to the first embodiment.
Figure 5:
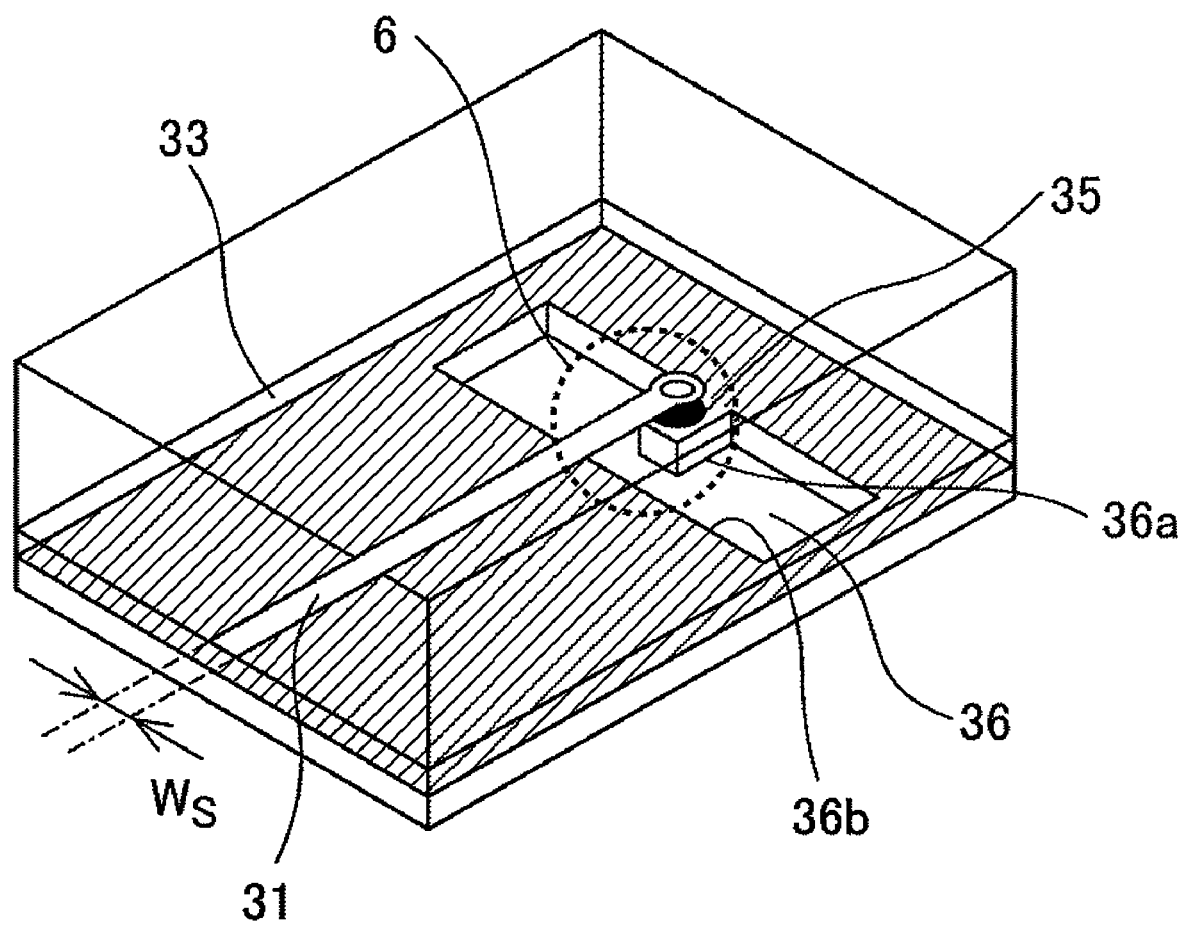
FIG. 5 is a bird's-eye view of the line transducer portion of FIG. 4.

The construction and function of the vertical transducer 6 which is a characteristic feature of the invention, will now be described in detail referring to FIG. 4 and FIG. 5. FIG. 4 is a vertical cross-section showing an example of a line transducer portion of a microstrip line and waveguide in the millimeter waveband transceiver 100. FIG. 5 is a bird's-eye view showing the line transducer portion of FIG. 4. Numeral 31 is a main line of a microstrip line, 32 is a standard waveguide, and 33 is a dielectric substrate for forming the microstrip line. The line transducer portion includes a transmission mode transducer, i.e., the vertical transducer 6, between the main line 31 of the microstrip line, and the λ/4 matching box 7. The vertical transducer 6 connected between the microstrip line and standard waveguide includes a waveguide transducer, i.e., a ridged waveguide section. In this embodiment, a characteristic impedance ($Z_2$) of the waveguide transducer is equal to or less than the characteristic impedance ($Z_1$) of the microstrip line.

The vertical transducer 6 includes an electrically conductive conductor 34, a via 35 that electrically connects the main line 31 with the electrically conductive conductor 34, and a ridged waveguide section 36 of reduced impedance. 36a is a ridge of the ridged waveguide section connected to the via 35, and 36b is a ridge of a ridged waveguide section that also serves as a GND conductor of the microstrip line 31. The microstrip line 31 and ridged waveguide section 36 are connected at right angles by the vertical transducer 6. The ridged waveguide section 36 and λ/4 matching box 7 are formed of the same material as that of the electrically conductive conductor, and are designed to have the same potential under a direct current.

The construction and the effect of making the characteristic impedance ($Z_2$) of the waveguide transducer equal to or less than the characteristic impedance ($Z_1$) of the microstrip line, will now be described. In FIG. 4 and FIG. 5, a ridged gap is WR, a dielectric thickness is MSLts, and a width of the microstrip line is WS. In the ridged waveguide 36, the length of the shorter side of the rectangular cross-sectional opening is twice or more than twice the thickness MSLts of the dielectric 33 of the microstrip line. Near the center of one or both of the long sides of the ridged waveguide cross-section, a projection (ridge) having a distance from the nearest contact part of twice or less than twice the dielectric thickness MSLts, projects towards the center of the rectangle, and is connected such that the characteristic impedance of the waveguide is equal to or less than that of the microstrip line.

The thickness of the ridged waveguide section 36 is λ/16 or less.

The characteristic impedances are defined as follows. The impedance of the microstrip line 31 is $Z_1$, impedance of the ridged waveguide section 36 is $Z_2$, impedance of the λ/4 matching box 7 is $Z_3$, and impedance of the standard waveguide 32 is $Z_4$. When it is attempted to connect the microstrip line 31 with the standard waveguide 32, if only line matching is taken into consideration, the reflection coefficient is the smallest when the characteristic impedance increases (decreases) in the connection sequence. In other words, if only line matching is taken into consideration, the impedances have the magnitude relationship of inequality (3):

$$Z_1 < Z_2 < Z_3 < Z_4 \quad (3)$$

On the other hand, we have discovered that in the line conversion between the TEM waves of the microstrip line and the TE01 mode waves of the waveguide, if the cross-sections are substantially of the same size, the electromagnetic wave distribution of the TEM waves of the microstrip line is equivalent to the electromagnetic wave distribution of the TE01 mode waves around the ridges of the ridged waveguide, and the line conversion loss decreases.

Based on this observation, FIG. 5 shows a line transducer (hereafter, vertical transducer) connecting the ridged waveguide with a microstrip line at right angles.

The microstrip line is open on its main line upper surface. When the cross-sections of the microstrip line and ridged section of the ridged waveguide are of substantially the same size, since the ridged waveguide is surrounded by metal shielding, the capacitance component of the rectangular part of the waveguide cross-section, except around the ridges, reduces the impedance when the cut-off frequency of the waveguide is reduced, so the characteristic impedance becomes lower than that of the microstrip line.

Figure 6:
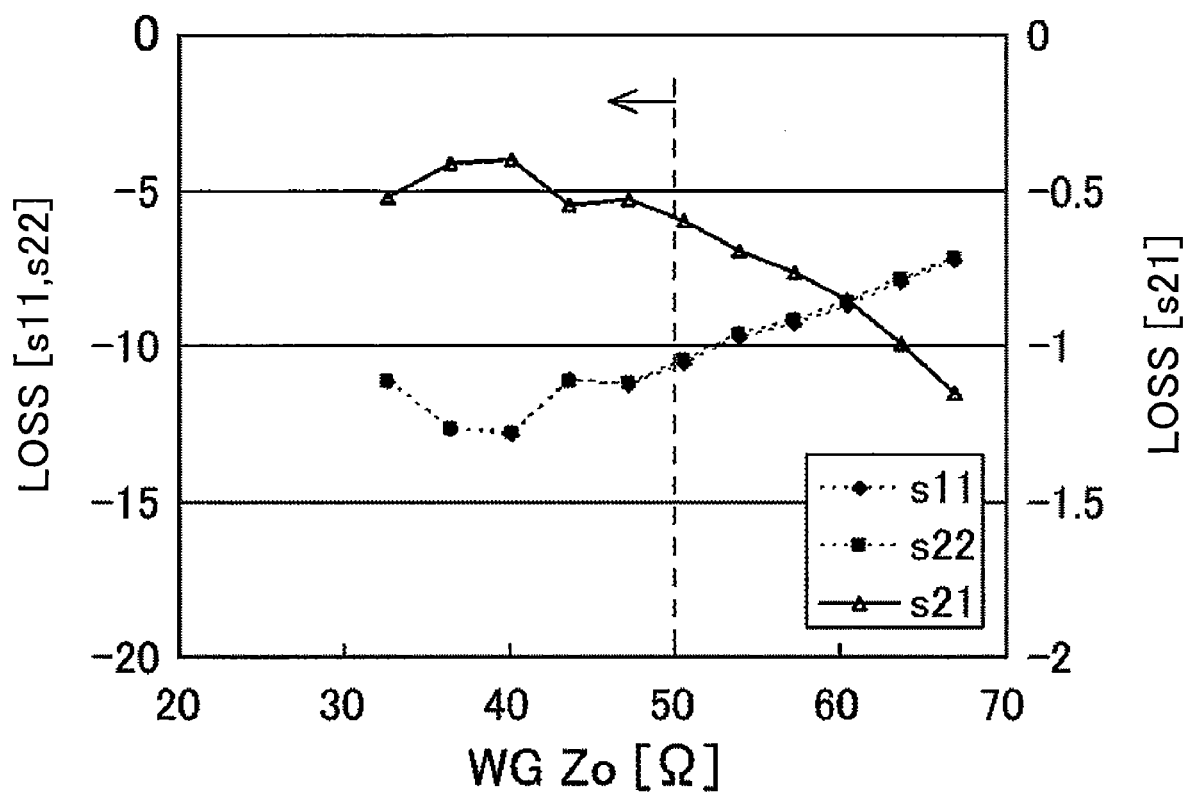
FIG. 6 is a diagram showing the frequency characteristics of a vertical transducer according to the invention.
Figure 7A:
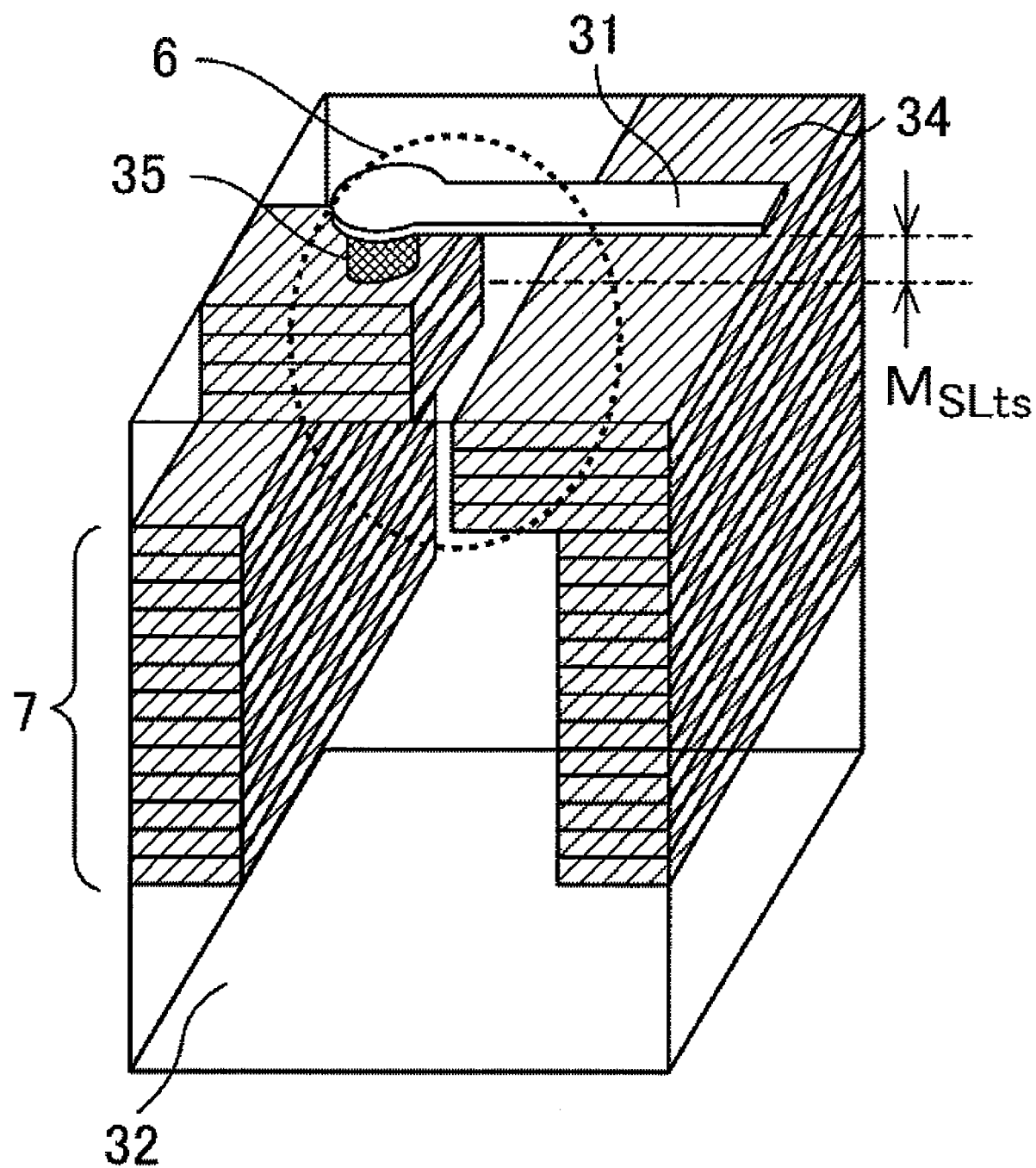
FIG. 7A is a perspective view of a line transducer portion of a microstrip line and a waveguide in the millimeter waveband transceiver according to the first embodiment.
Figure 7B:
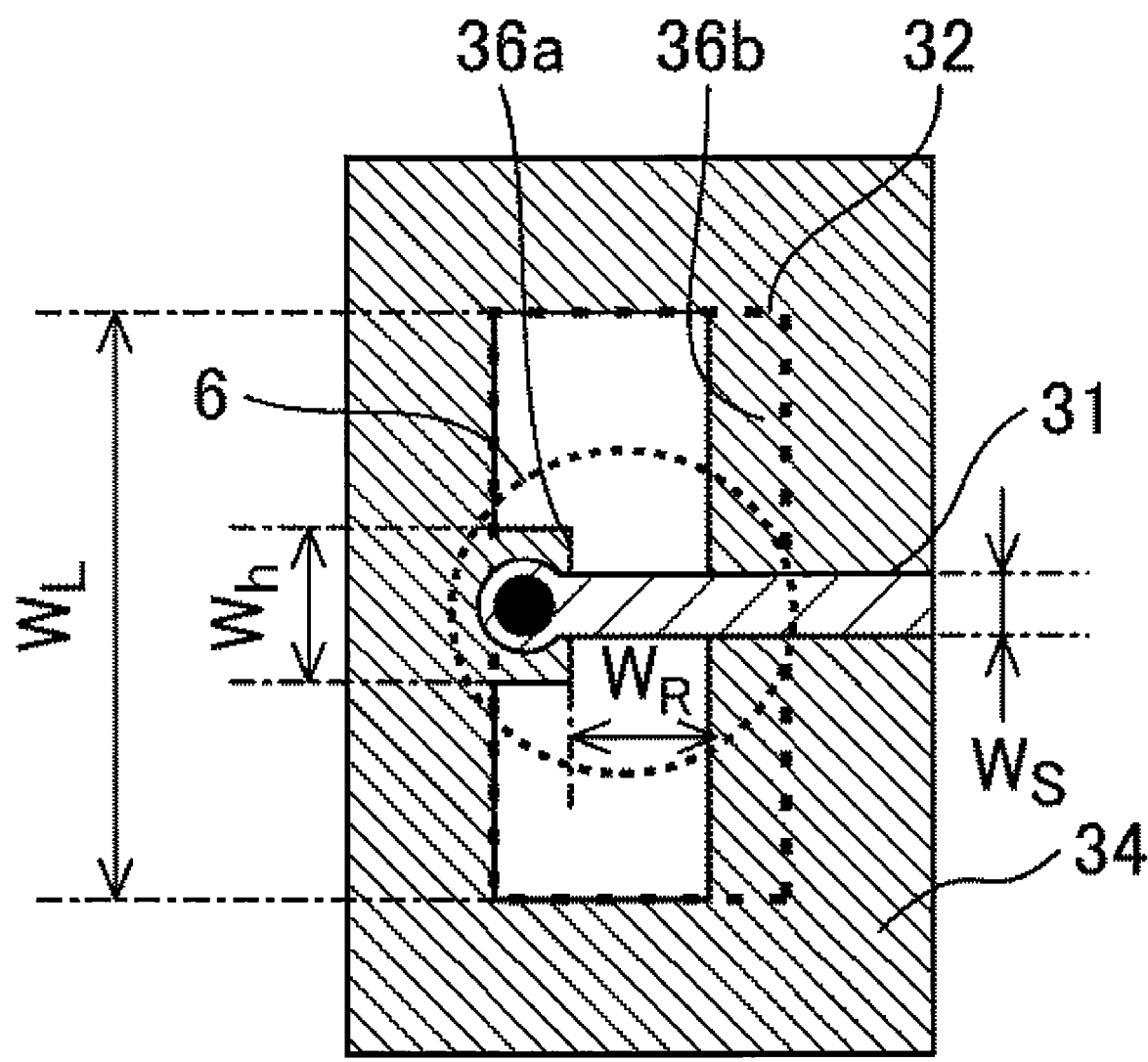
FIG. 7B is a plan view of FIG. 7A.

FIG. 6 and FIG. 7 are diagrams of calculation results showing the frequency characteristics of the vertical transducer according to the invention. FIG. 6 shows the frequency characteristics of the vertical transducer 6. FIG. 7A shows one example of a perspective view of a line transducer portion of a microstrip line and waveguide in the millimeter waveband transceiver 100. FIG. 7B is an upper plan view of FIG. 7A.

It will be assumed that the characteristic impedance of the microstrip line is designed to be 50Ω taking account of matching between the measurement system and the IC of the RF circuit. As shown in FIG. 6, in a construction wherein the microstrip line 31 is connected with the ridged waveguide 36 at right angles, if the cross-sections of the microstrip line and the ridges of the ridged waveguide are substantially the same size, i.e., when the characteristic impedance of the ridged waveguide is 40Ω, it is very small. In other words, as regards the line transducer between the ridged waveguide 36 and the microstrip line 31, from the calculation result of FIG. 6, when the microstrip line is 50Ω and when the characteristic impedance of the ridged waveguide section 36 is 40Ω, the reflection characteristic is very small.

Therefore, when converting from the TE01 transmission mode of the waveguide to the TEM transmission mode of the microstrip line, minimization of the line loss can be expected by interposing a waveguide having a lower impedance than that of the microstrip line.

Therefore, we have discovered that for a waveguide which is a contact point with the microstrip line, it is desirable to reduce the characteristic impedance of the waveguide lower than that of the microstrip line, the optimum value being about 80% (70 to 90%). Therefore, the impedance $Z_2$ of the ridged waveguide 36 in the vertical transducer 6 is a lower impedance than that of the microstrip line 31, and the magnitude relationship of inequality (4) holds.

$$Z_2 \leq Z_1 < Z_3 < Z_4 \tag{4}$$

To satisfy inequality (4), in the ridged waveguide 36 in FIG. 4, the size of the ridges 36a, 36b is specified. Specifically, the length Wh in the long direction of the ridged waveguide cross-section of the ridge 36a connected with the microstrip line 31 via the via 35, is arranged to be twice or less than twice the microstrip line width Ws, the length WL in the long direction of the ridged waveguide section of the ridge 36b of the electrically conductive conductor 34 that functions as a GND electrode of the microstrip line, is arranged to be three times or more than three times the microstrip line width, the gap WR of the ridged opening is arranged to be twice or less than twice than the thickness MSLts of the dielectric 33, and the thickness WL of the ridged cross-section 36 is arranged to be $\lambda/16$ or less. Since the impedance as seen from the $\lambda/4$ matching box 7 becomes closer to the value of the microstrip line when the phase rotation due to millimeter wave transmission in the ridged waveguide section 36 becomes small, matching with the $\lambda/4$ matching box 7 is improved.

In other words, from the result of FIG. 6, in order to reduce the characteristic impedance, in the construction of the ridged waveguide 36 in the vertical transducer 6, it is preferable that the ridge 36a connected with the microstrip line 31 via the via 35, has a length Wh which is twice or less than twice that of the microstrip line width WS, that the ridge 36b which functions as the ground electrode of the microstrip line has a length WL which is three times or more than three times the microstrip line width WS, and that the gap WR between ridges is twice or less than twice that of the thickness MSLts of the dielectric 33 (via 35).

According to this embodiment, in the line conversion between the microstrip line and the waveguide, the loss which arises during transmission mode conversion between the TEM waves of the microstrip line and the waveguide TM01 waves is reduced by interposing an vertical transducer having a ridged waveguide section of lower impedance than that of the microstrip line. By using a waveguide for the antenna input/output terminals, the millimeter waveband transceiver can have antenna characteristics with various azimuth angles, and the RF circuit section can be applied in a wide variety of situations. Further, by designing a $\lambda/4$ matching box for which the input/output terminal impedance ratio is 3 or less in part of the heat transfer plate, plural functions such as impedance conversion and dissipation of the heat emitted by the RF circuit section can be implemented, a low loss millimeter waveband transceiver can be manufactured, and circuit components can be made thinner.

Second Embodiment

Figure 8A:
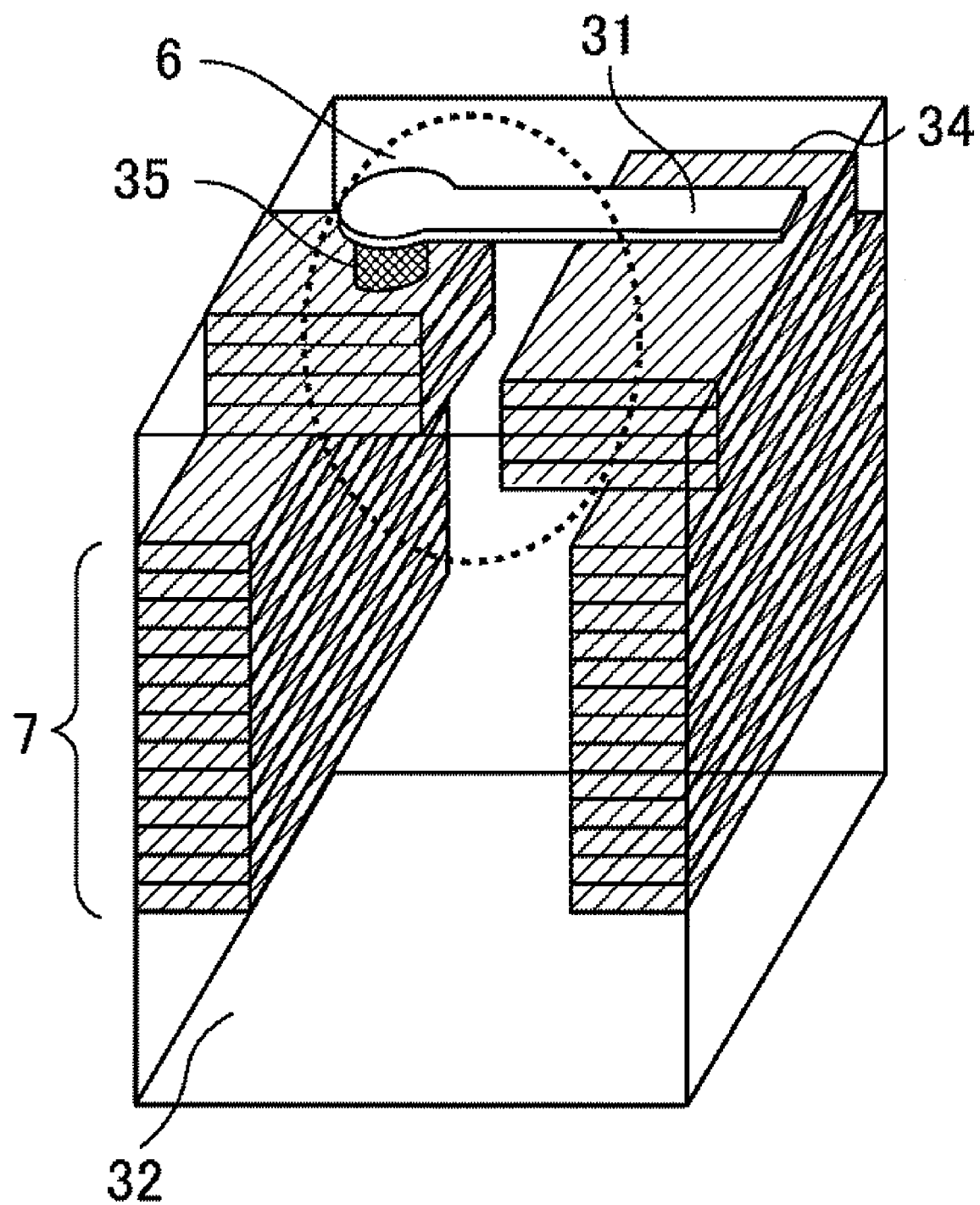
FIG. 8A is a perspective view of a millimeter waveband transceiver for a radar according to a second embodiment of the invention.
Figure 8B:
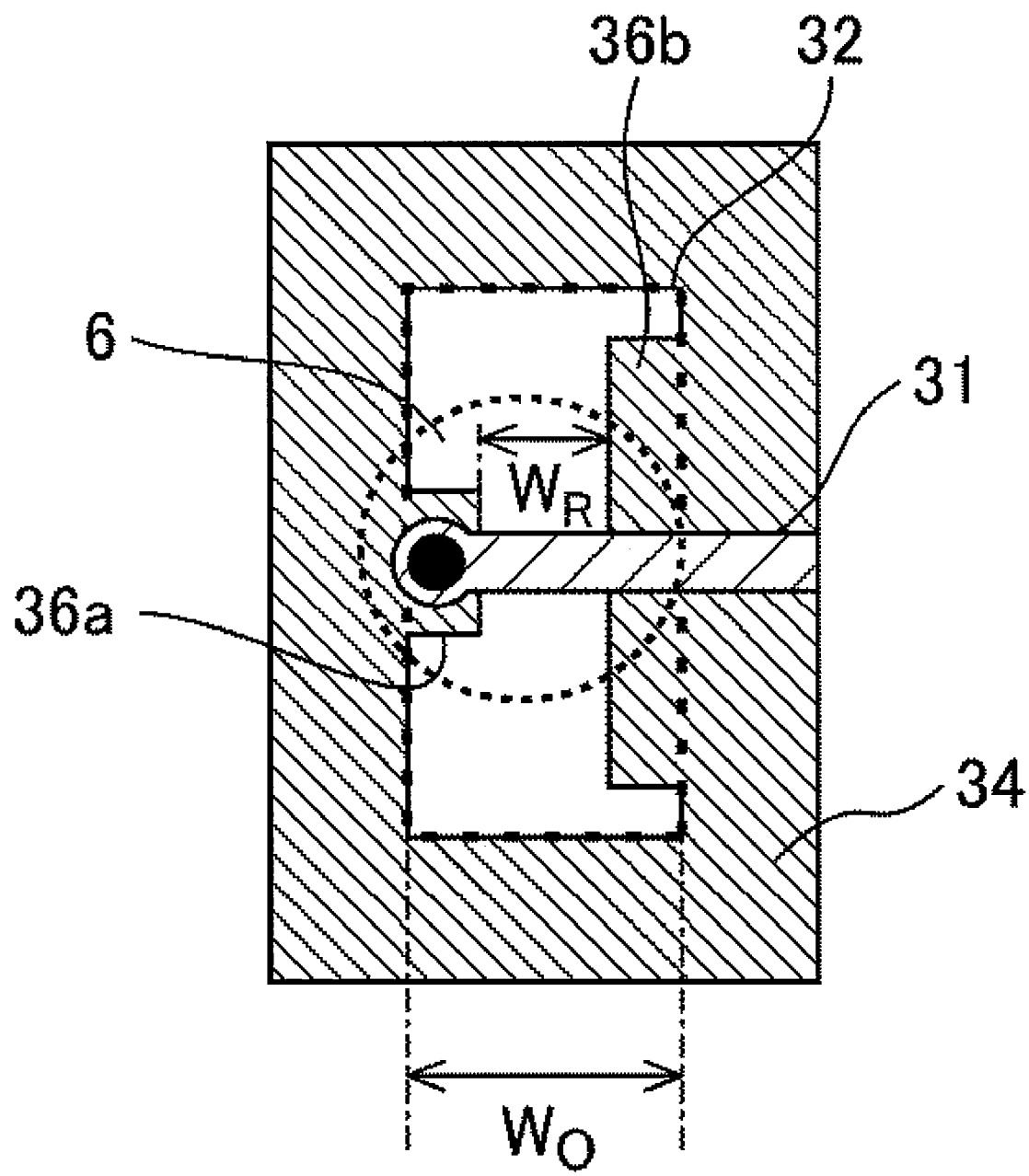
FIG. 8B is a plan view of FIG. 8A.

A second embodiment of the invention will now be described referring to FIGS. 8 (FIG. 8A, FIG. 8B). FIG. 8A is a perspective view of a line transducer portion of a microstrip line and waveguide in the millimeter waveband transceiver 100 according to the second embodiment. FIG. 8B is an upper plan view of FIG. 8A. In the ridged waveguide 36 of the vertical transducer 6, the shorter side of the rectangular cross-sectional opening is twice or more than twice the thickness MSLts of the via 35 of the microstrip line 31. Near the center of both of the long sides (ridged opening gap) of the waveguide cross-section, a ridge 36a having twice or less than twice the dielectric thickness of the opening distance WR of the nearest contact part projects towards the centre of the rectangle, the width of the other ridge 36b is twice or more than twice the width of the ridge 36a, and they are connected such that the characteristic impedance of the waveguide is equal to or less than that of the microstrip line. In this structure also, identical effects to those of the first embodiment are obtained.

Third Embodiment

Figure 9:
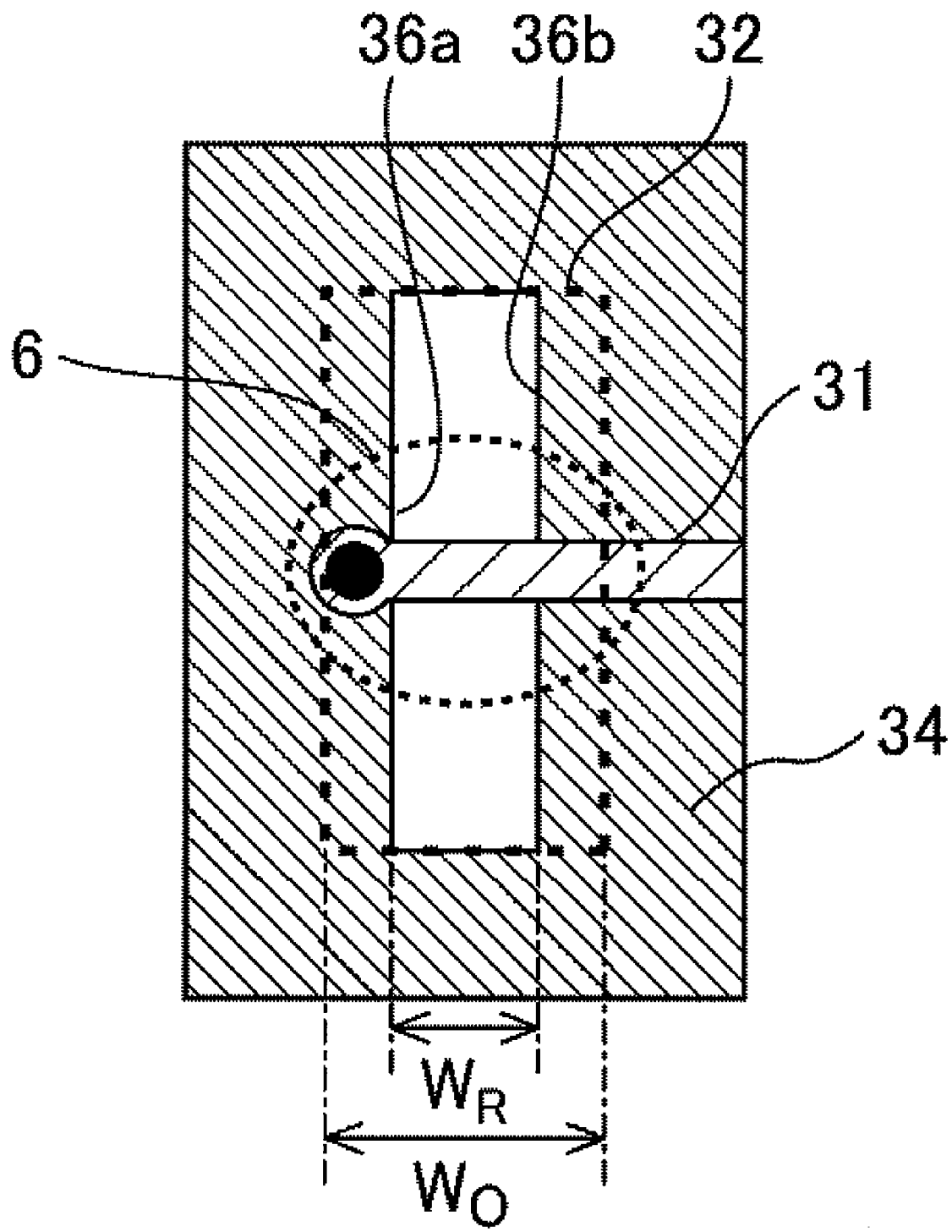
FIG. 9 is plan view of a line transducer portion of a microstrip line and a waveguide of a millimeter waveband transceiver according to a third embodiment of the invention.

FIG. 9 is an upper plan view of a third embodiment of a line transducer portion of a microstrip line and waveguide in the millimeter waveband transceiver 100. The waveguide cross-section is rectangular and the gap WS between the long sides is narrower than the ridged opening gap W0. In other words, the ridge 36a, which is connected with the microstrip line 31 via the via 35, is given the same shape as that of the ridge 36b that functions as a GND electrode of the microstrip line. In this example, if a low impedance waveguide wherein the ridged opening is rectangular is used, although the electromagnetic wave distribution of the TEM waves of the microstrip line is different from the electromagnetic wave distribution of the TE01 mode waves around the ridges of the ridged waveguide, provided the loss design specification of the transceiver is satisfied, and provided the passband width lower limit and the cut-off frequency of the vertical transducer coincide, a rectangular waveguide cross-section with a large loss may be used. When machining the ridged waveguide section 36 and $\lambda/4$ matching box 7, if the electrically conductive conductor is of metal, metal plates having a thickness of 1 mm or less which can easily be pressed are punched out in a hollow shape or an I shape by a press, and superimposed in the waveguide progression direction.

Fourth Embodiment

Figure 10:
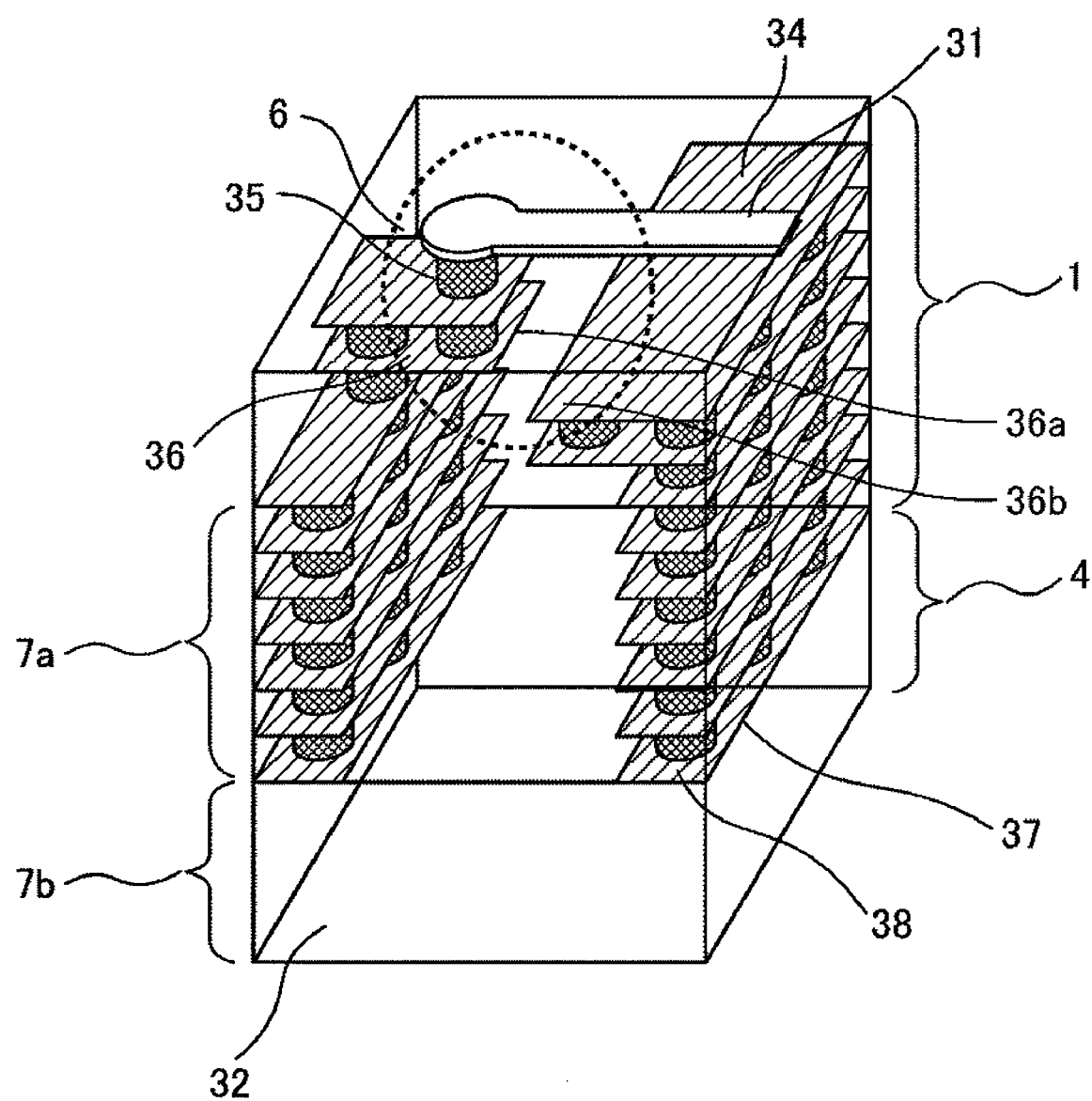
FIG. 10 is a perspective view of a line transducer portion of a microstrip line and a waveguide of a millimeter waveband transceiver according to a fourth embodiment of the invention.

A fourth embodiment of the line transducer portion of a microstrip line and waveguide in the millimeter waveband transceiver 100, will now be described referring to FIG. 10. FIG. 10 is a perspective view of the millimeter waveband transceiver 100.

In this embodiment, a ridged waveguide including an vertical transducer 6 and a $\lambda/4$ matching box 7a manufactured from a multilayer substrate, is formed extending through to the undersurface of the multilayer substrate by alternately laminating a dielectric film and a metal conductor film, patterning a hollow shape or I shape in the metal conductor films, and electrically connecting the metal conducting films via the vias 35, 38. In this example, the ridged waveguide includes 9 dielectric layers. Numeral 6 is the vertical transducer formed in the multilayer substrate 1, and 7a is $\lambda/4$ matching box formed from an artificial-waveguide in the multilayer substrate 1. Numeral 7b is a $\lambda/4$ matching box provided in the heat transfer plate 4. Numeral 31 is the main line of the microstrip line manufactured on one surface of the multilayer substrate, 32 is a standard waveguide, 34 is an electrically conductive conductor manufactured from metal patterns and vias in the multilayer substrate 1, 35 is a via connecting the ridge part 36a of the ridged artificial-waveguide section 36 of the electrically conductive conductor 34 with the microstrip line 31, and 36 is an artificial-ridged waveguide section that mimics a ridged waveguide and is part of the electrically conductive conductor. The ridge 36a of the ridged waveguide section is connected to the microstrip line 31 via the via 35, and the ridge 36b functions as a GND conductor of the microstrip line 31. The metal pattern 37 forming the electrically conductive conductor is substantially rectangular, and has a hollow or I-shaped notch. The vias 35 formed in the multilayer substrate 1 may be one or an odd number of vias disposed so as not to interfere with the current flowing along the strong field of the transmission mode TE1 of the ridged waveguide. The λ/4 matching box 7 (7a, 7b) is used to match the characteristic impedance of the ridged waveguide section 36 of the vertical transducer 6 with the standard waveguide 32.

According to this embodiment, in the line conversion between the microstrip line and the waveguide, the loss which arises during transmission mode conversion between the TEM waves of the microstrip line and the waveguide TM01 waves is reduced by interposing an vertical transducer having a ridged waveguide section of lower impedance than that of the microstrip line. Also, by using a waveguide for the antenna input/output terminals, the millimeter waveband transceiver can have antenna characteristics with various azimuth angles, and at the same time, the RF circuit section can be applied in a wide variety of situations. Further, by designing a λ/4 matching box for which the input/output terminal impedance ratio is 3 or less in part of the heat transfer plate, plural functions such as impedance conversion and dissipation of the heat emitted by the RF circuit section can be implemented, a low loss millimeter waveband transceiver can be manufactured, and circuit components can be made thinner.

Fifth Embodiment

Figure 11:
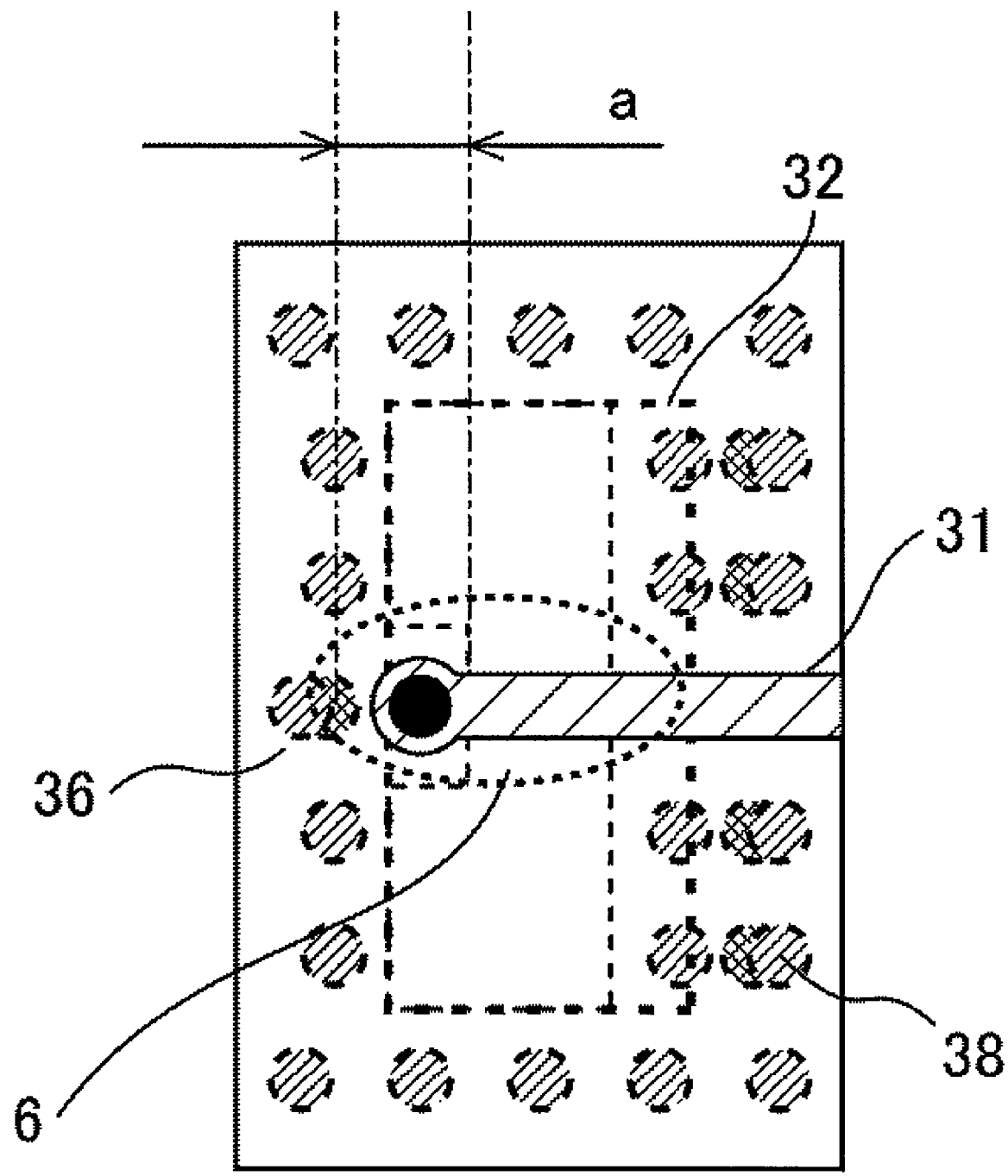
FIG. 11 is a diagram showing a microstrip line and a waveguide of a millimeter waveband transceiver according to a fifth embodiment of the invention, corresponding to a plan view of FIG. 10.

FIG. 11 shows a fifth embodiment of the line transducer portion of the microstrip line and waveguide of the millimeter waveband transceiver 100 according to the invention. FIG. 11 corresponds to an upper plan view of the millimeter waveband transceiver 100 shown in FIG. 10.

Vias 38 are disposed between layers in order to share the potential of the metal pattern 37 of each layer of the multilayer substrate 1. The distance of the ridges 36a, 36b from their projecting ends to the virtual GND surface of the rectangular artificial-waveguide is suppressed to be less than λ/4 so that stationary waves are not formed in the ridges. The vias 38 in the ridged waveguide section 36 are part of the electrically conductive conductor 34, these vias being provided in the ridge projection direction. The ridged waveguide section 36 and λ/4 matching box are formed by patterning a hollow or I-shaped notch in the metal pattern 37 of the multilayer substrate 1, the vias 38 interconnecting the metal layers.

The millimeter waveband transceiver 100 of this embodiment is a structure wherein the microstrip line 31, dielectric substrate 33, and electrically conductive conductor 34 in FIG. 4 are formed in the multilayer substrate 1.

According to this embodiment, in the line conversion between the microstrip line and the waveguide, the loss that arises during transmission mode conversion between the TEM waves of the microstrip line and the waveguide TM01 waves is reduced by interposing an vertical transducer having a ridged waveguide section of lower impedance than that of the microstrip line. Also, by using a waveguide for the antenna input/output terminals, the millimeter waveband transceiver can have antenna characteristics with various azimuth angles, and at the same time, the RF circuit section can be applied in a wide variety of situations.

Figure 12:
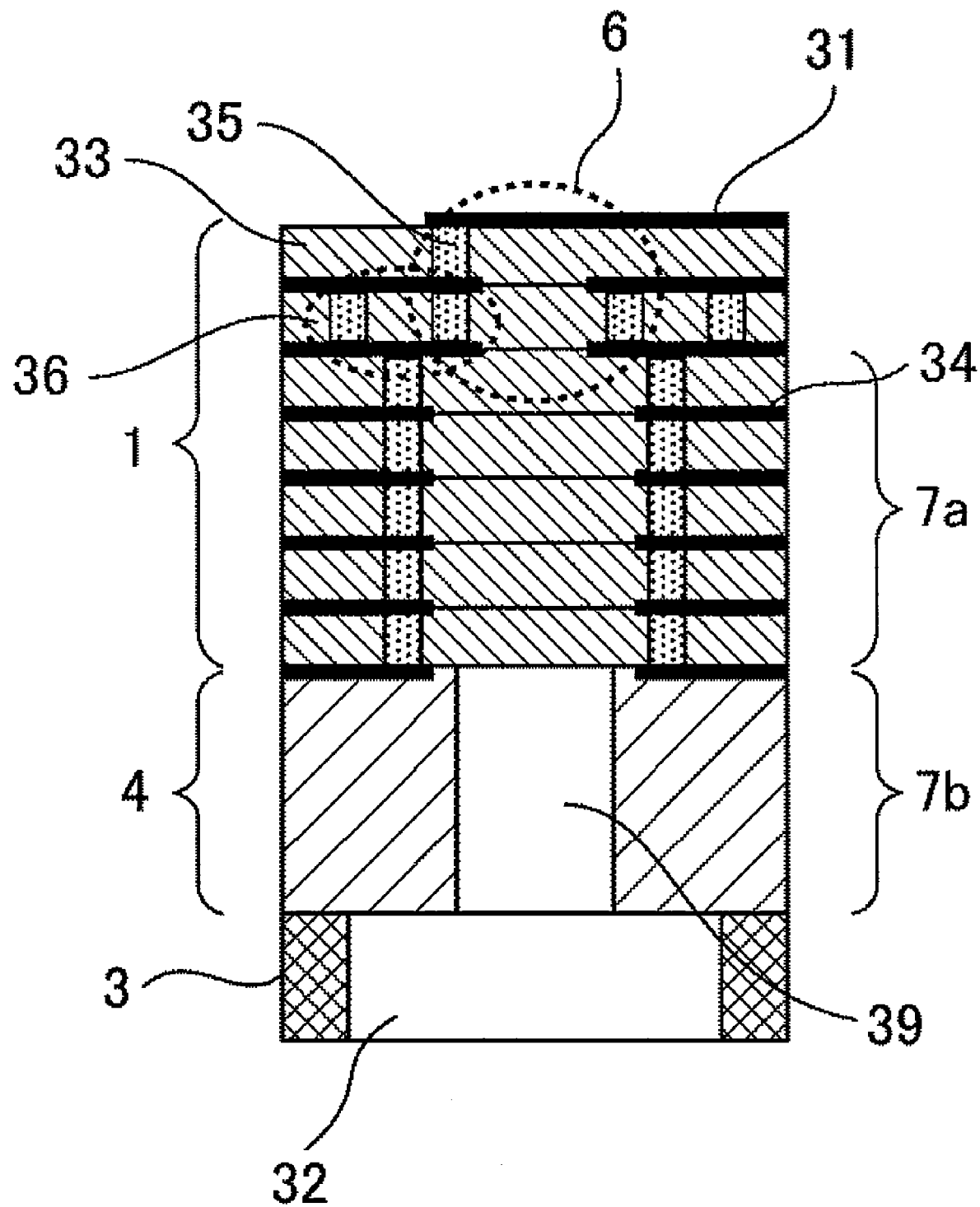
FIG. 12 is a vertical cross-section of a line transducer portion of a microstrip line and a waveguide of a millimeter waveband transceiver according to a sixth embodiment of the invention.
Figure 13:
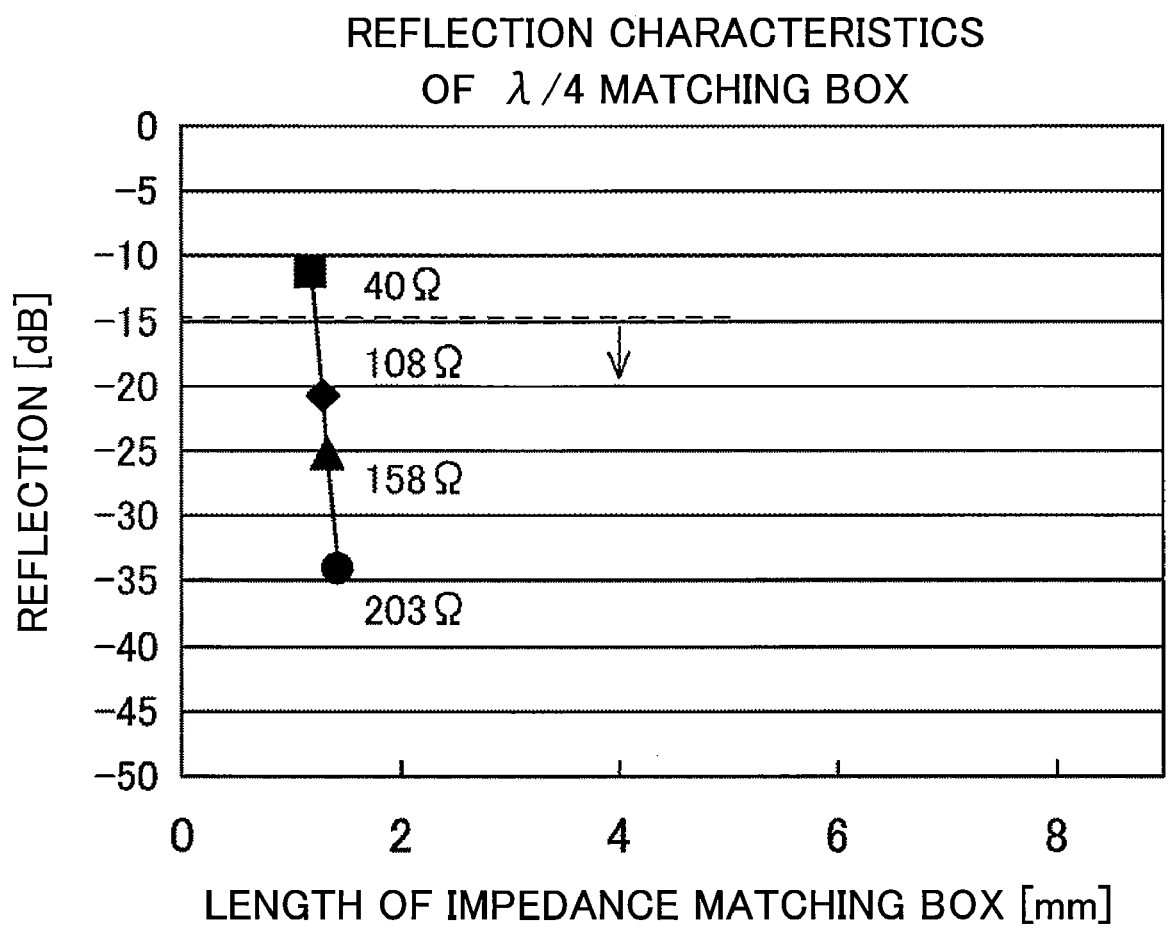
FIG. 13 is a diagram showing the reflective characteristics of a line transducer using an ordinary λ/4 transducer.

FIGS. 12 and 13 describe a sixth embodiment of the line transducer portion of the microstrip line and waveguide of the millimeter waveband transceiver 100 of the invention.

FIG. 12 shows a vertical cross-section of the line transducer portion of this embodiment. The millimeter waveband transceiver 100 of this embodiment includes the multilayer substrate 1, RF circuit 2, antenna 3, heat transfer plate 4, vertical transducer 6, λ/4 matching boxes 7a, 7b, standard waveguide 32 and low impedance ridged waveguide 36. The vertical transducer 6 having the low impedance ridged waveguide section 36 and the λ/4 matching box 7a are formed in the multilayer substrate 1. The λ/4 matching box 7b, formed of an electrically conductive conductor having a lower impedance than that of the standard waveguide 32 which constitutes the input/output terminals of the antenna 3, and a higher impedance than that of the λ/4 matching box 7a in the multilayer substrate 1, is formed in the heat transfer plate 4.

An essential feature of this embodiment is that the line transducer portion is formed from the vertical transducer 6 having a ridged waveguide section of lower impedance than the microstrip line formed in the multilayer substrate 1, and the λ/4 matching box 7a which is an artificial-waveguide formed in the multilayer substrate 1. Accordingly, the length of the impedance matching box can be made short, and the modular thickness of the millimeter waveband transceiver 100 can be suppressed.

As shown in FIG. 13, from the 40Ω ridged waveguide section 36 to the 300+Ω standard waveguide 32, when impedance conversion is performed using a single λ/4 transducer (the impedance of the λ/4 transducer input terminal is 40Ω), the reflection loss is about −1 2dB and the passband loss is about −2.5 dB. When the impedance of the λ/4 transducer input terminal, wherein the impedance ratio of the input/output terminals of the λ/4 matching box is 4 (≈380Ω/100Ω) or less, is 100Ω, a λ/4 matching box giving a good reflected loss can be realized. According to this embodiment, the length of the matching box giving the desired reflection loss is about 1.2 mm. The length of the λ/4 matching box 7a formed in the multilayer substrate 1 is 1.2 mm/√(dielectric constant of multilayer substrate 1).

Since the impedance ratio of the ridged waveguide section 36 and standard waveguide 32 is about 9 (≈380Ω/40Ω), by connecting the two λ/4 matching boxes 7a, 7b having an impedance ratio at the input/output terminals of about 3, in series, impedance conversion between the ridged waveguide section 36 and the standard waveguide 32 can be realized with low loss.

The characteristic impedance of the λ/4 matching box 7a when it is directly connected to a 50Ω microstrip line is designed to be 70Ω (≈√(100*50)). When the ridged waveguide section of low impedance forming the vertical transducer 6 which is a characteristic feature of the invention, is inserted at the input terminal of the λ/4 matching box 7a, from the result of FIG. 6, the passband loss accompanying transmission mode conversion from the microstrip line to the waveguide, can be expected to improve by about 0.6 dB from 1.2 dB@70Ω to 0.4 dB@40Ω.

Although the impedance ratio of the λ/4 matching box 7a input/output terminals varies from 2 to 2.5, it is still three times or less than three times the design specification of the λ/4 matching box, so the increase of reflection loss is minimized.

Therefore, there is a large effect obtained by inserting the ridged waveguide section of the impedance forming the vertical transducer 6, and assembly loss due to the millimeter waveband transceiver as a whole can easily be reduced. The same effect can also be obtained even in the case of a single λ/4 matching box, and it is therefore an important technique for connecting from a microstrip line to a waveguide.

According to this embodiment, in the line conversion between the microstrip line and the waveguide, the loss which arises during transmission mode conversion between the TEM waves of the microstrip line and the waveguide TM01 waves is reduced by interposing an vertical transducer having a ridged waveguide section of lower impedance than that of the microstrip line. Also, by using a waveguide for the antenna input/output terminals, the millimeter waveband transceiver can have antenna characteristics with various azimuth angles, and the RF circuit section can be applied in a wide variety of situations.

Further, by designing a λ/4 matching box for which the input/output terminal impedance ratio is 3 or less in part of the heat transfer plate, plural functions such as impedance conversion and dissipation of the heat emitted by the RF circuit section can be implemented, a low loss millimeter waveband transceiver can be manufactured, and circuit components can be made thinner.

Seventh Embodiment

Figure 14A:
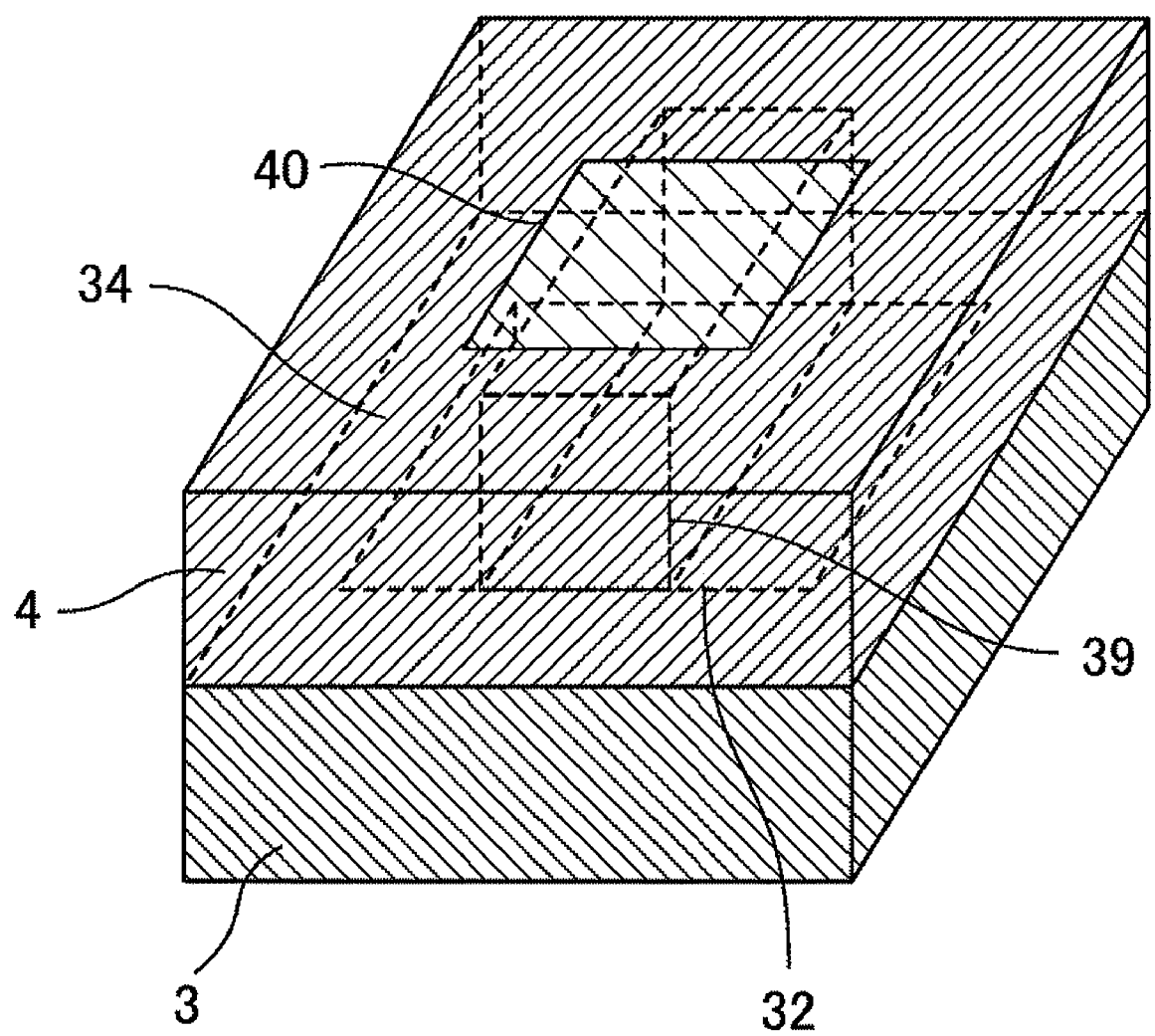
FIG. 14A is a perspective view of a ridged waveguide section of a millimeter waveband transceiver according to a seventh embodiment of the invention.
Figure 14B:
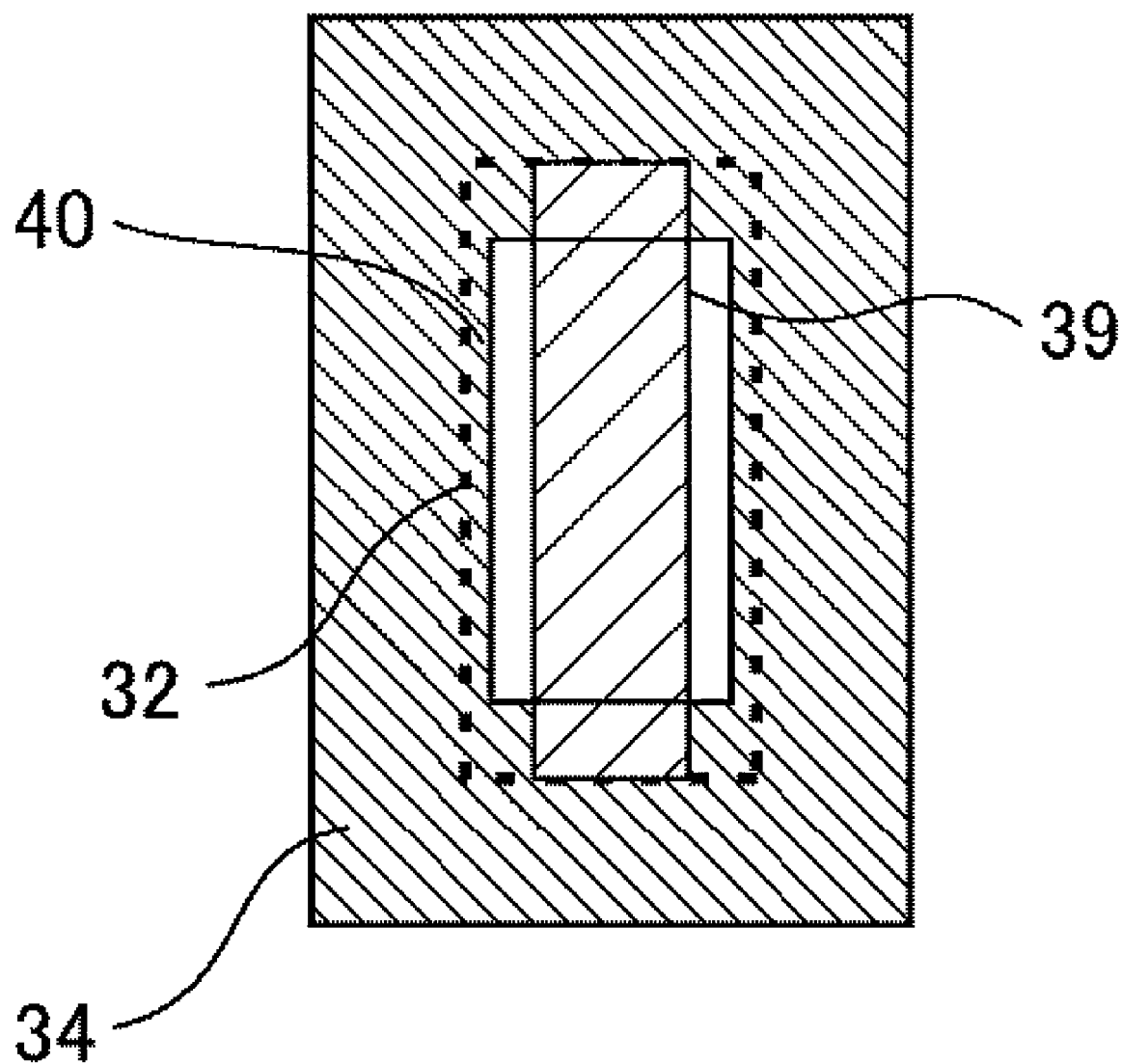
FIG. 14B is a plan view of FIG. 14A.

FIG. 14 shows a seventh embodiment of the line transducer portion of a microstrip line and waveguide in the millimeter waveband transceiver 100. FIG. 14A is a perspective view of the ridged waveguide section, and FIG. 14B is an upper plan view of the ridged waveguide section. In this embodiment, λ/4 matching boxes having a characteristic impedance ratio 3 or less are provided between the input and output terminals of at least one or more of the multilayer substrate 1, the heat transfer plate 4 and the antenna holding plate 10 forming the millimeter waveband transceiver.

In FIG. 14A, FIG. 14B, numeral 3 is the antenna, 32 is the standard waveguide of the input/output terminals of the antenna 3, and 34 is the electrically conductive conductor in the multilayer substrate 1. Numeral 39 is a λ/4 matching box wherein the λ/4 matching box 7b is filled with a dielectric of different dielectric constant from that used for the multilayer substrate, and 40 is a waveguide opening in the lowermost metal pattern of the λ/4 matching box 7a formed as part of the electrically conductive conductor 34 of the multilayer substrate 1. If the dielectric materials filling the waveguide unit of the λ/4 matching box 7a and λ/4 matching box 39 are different, since the in-tube wavelength is compressed by the dielectric constant, the size of the waveguide required to obtain a desired characteristic impedance is different due to the difference of the in-tube wavelength. Matching errors arise due to the machining precision when the multilayer substrate 1 and heat transfer plate 4 are superimposed, and fluctuation occurs in the frequency characteristics of the impedance conversion.

In order to suppress this characteristic fluctuation, the design is such that, when the dielectric constants of the dielectric material in the waveguides of the λ/4 matching box 7a and λ/4 matching box 39 are different, the openings of these waveguides are non-analogous, the long side of the waveguide opening rectangle is longer than the waveguide with a low dielectric constant, the short side of the waveguide opening rectangle is longer than the waveguide with a high dielectric constant, the length of the short side of the waveguide with a high dielectric constant is larger than twice the assembly specification error, and connection is made by the waveguides of the vertical transducer of the λ/4 matching box which performs impedance conversion of the antenna input/output terminals.

In other words, as shown in FIG. 14B, the shape of the waveguide opening 40 and the shape of the opening (shown by slanting lines) of the λ/4 matching box 39 are non-analogous. When the dielectric filling the λ/4 matching box 39 is air, the length of the long side of the opening of the λ/4 matching box 39 is arranged to be the same as the long side of the standard waveguide 32 so that the cut-off frequency of the standard waveguide 32 is not exceeded. If the dielectric constant of the λ/4 matching box 7a is higher than the dielectric constant of the λ/4 matching box 39, the short side of the waveguide opening 40 is designed to be longer than the short side of the opening of the waveguide 39. In the case of a ceramic material where the dielectric constant of the λ/4 matching box 7a is from 5 to about 20, in order to suppress the cut-off frequency and high order mode transmission of the λ/4 matching box 7a, the long side of the waveguide opening 40 is arranged to be $2/\sqrt{(Er)}$ or less than the long side of the standard waveguide 32.

By giving the opening shapes of the λ/4 matching box 7a and λ/4 matching box 39 point symmetry and making them non-analogous, balance between parasitic elements of the top/bottom/left/right impedance components and capacitance components is maintained even if there are errors during assembly of the multilayer substrate 1 and heat transfer plate 4, and matching with the impedance of the points between the λ/4 matching box 7a and λ/4 matching box 39 is maintained. Also, in order to suppress electrical characteristic fluctuations as far as possible, the length of the shortest part of the waveguide opening is preferably twice or more than twice the length of machining error in the assembly process.

According to this embodiment, in the line conversion between the microstrip line and the waveguide, the loss which arises during transmission mode conversion between the TEM waves of the microstrip line and the waveguide TM01 waves is reduced by interposing an vertical transducer having a ridged waveguide section of lower impedance than that of the microstrip line.

Further, fluctuation in the frequency characteristics of impedance conversion when matching errors arise due to machining precision when the multilayer substrate and heat transfer plate are superimposed, can be suppressed.

Eighth Embodiment

Figure 15:
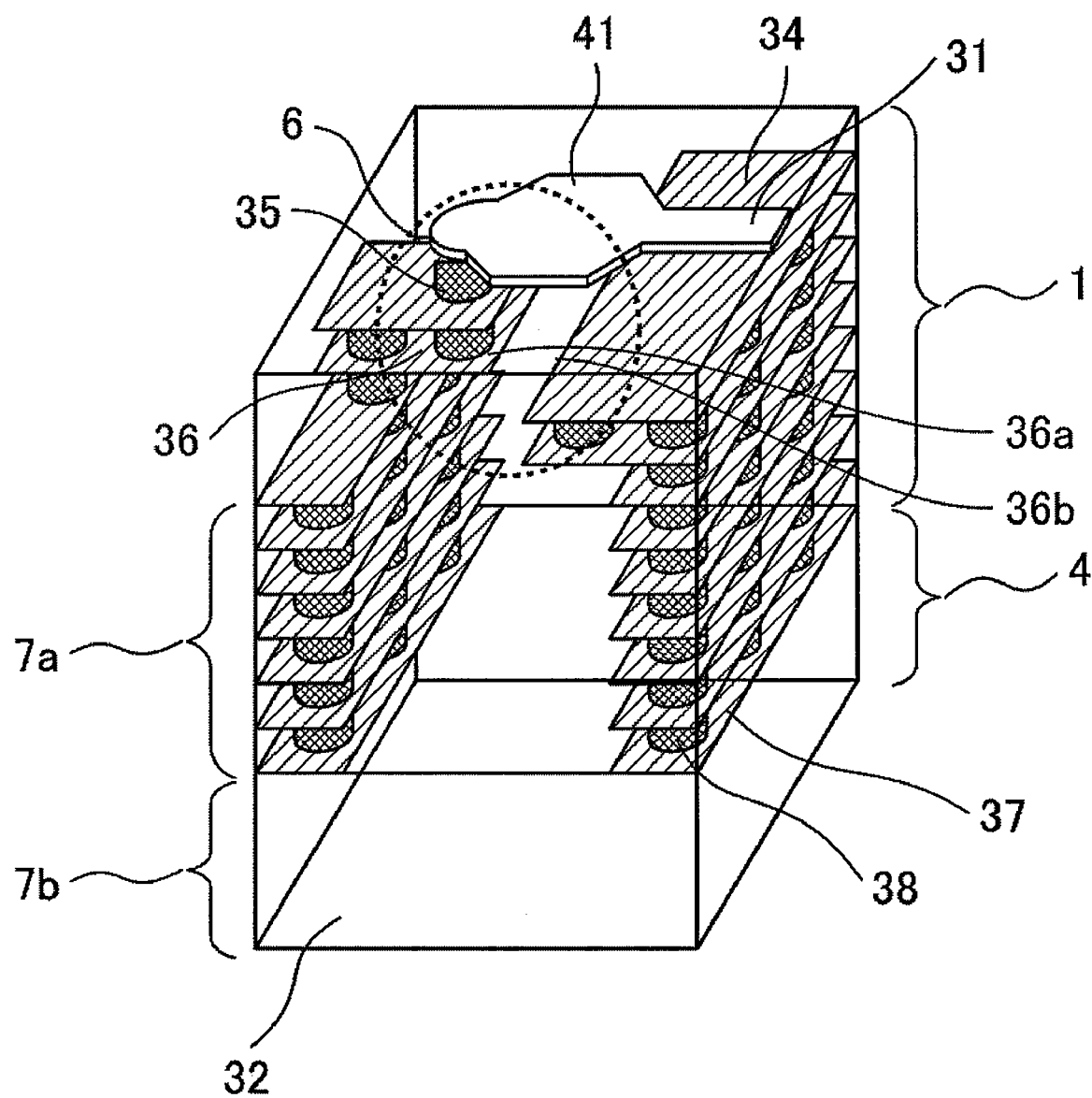
FIG. 15 is a perspective view of a ridged waveguide section of a millimeter waveband transceiver according to an eighth embodiment of the invention.
Figure 16:
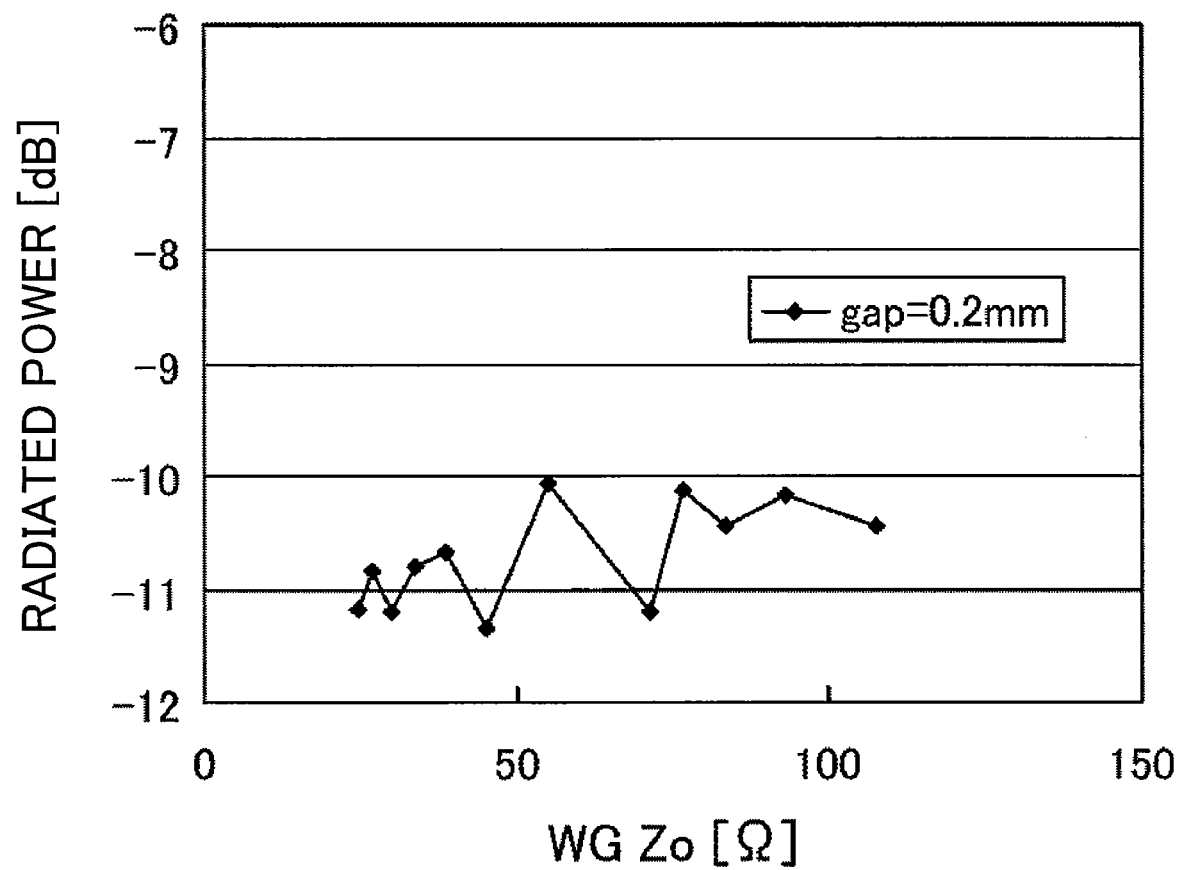
FIG. 16 is a diagram showing a radiation loss in a microstrip line having a notch of fixed length in a GND metal surface.

FIG. 15 and FIG. 16 describe an example using a spatial radiation-suppressing metal conductor pattern as an eighth embodiment of the line transducer portion of the microstrip line and waveguide according to the invention. FIG. 15 is a perspective view of the line transducer portion of the microstrip line and waveguide in the millimeter waveband transceiver.

In FIG. 15, numeral 1 is the multilayer substrate having one, two or more dielectric layers, 6 is the vertical transducer formed in the multilayer substrate 1, 7 is a λ/4 matching box including an artificial-waveguide formed in the multilayer substrate 1, 31 is the main line of the microstrip line formed on the top surface of the multilayer substrate 1, 32 is the standard waveguide, 34 is the electrically conductive conductor formed from metal patterns and vias in the multilayer substrate 1, 35 is a via connecting the ridged part 36a of the ridged artificial-waveguide section 36 of the electrically conductive conductor 34 with the microstrip line 31, and 36 is the artificial-ridged waveguide section which mimics a ridged waveguide and is part of the electrically conductive conductor. Numeral 36a is the ridge of the ridged waveguide section connected to the microstrip line 31 via the via 35, and 36b is the ridge of the ridged waveguide section that serves as a GND conductor of the microstrip line 31. Numeral 37 is a metal pattern which is substantially rectangular formed by punching a hollow or I shape, which forms the electrically conductive conductor. Numeral 38 is an inter-layer via for sharing the potentials of each layer of the metal pattern 37 of the multilayer substrate 1. Numeral 41 is a metal conductor pattern for suppressing spatial radiation.

According to this embodiment, near the edge of the metal conductor which is the GND electrode opposite the microstrip line, the metal conductor pattern 41 which is wider than the microstrip line which is the transmission line, is disposed in the multilayer substrate top layer immediately prior to connecting with a waveguide having a smaller characteristic impedance than the microstrip line. A characteristic feature is that the majority of millimeter TEM waves concentrate immediately beneath the wide metal conductor pattern 41.

FIG. 16 shows the radiation loss in a microstrip line having a notch of fixed length in the GND metal surface. The horizontal axis is the impedance of the microstrip line, and the vertical axis is the radiation power loss in the distant field. It is seen that the lower the impedance is, the smaller the radiated power loss is. It is evident that, since electromagnetic waves concentrate immediately beneath the line the wider the line width of the microstrip line is, the radiated loss decreases. By providing the wider radiation suppression metal conductor pattern 41 on the main line conductor surface of the microstrip line of the vertical transducer 6, the radiated loss in the part arranged to be at right angles to the ridged waveguide section 36 can be reduced. Further, in the top layer of the multilayer substrate 1, the vertical transducer 6 eliminates metal conductors apart from the microstrip line 31 and spatial radiation-suppression metal conductor pattern 41, or the distance between metal conductors is made greater than $\lambda/4$, so that unwanted parasitic elements are led off, and the loss does not increase.

According to this embodiment, in the line conversion between the microstrip line and the waveguide, the loss which arises during transmission mode conversion between the TEM waves of the microstrip line and the waveguide TM01 waves is reduced by interposing an vertical transducer having a ridged waveguide section of lower impedance than that of the microstrip line. Further, radiated loss due to line mismatch in the line conversion between the microstrip line and the waveguide is reduced.

Ninth Embodiment

Figure 17:
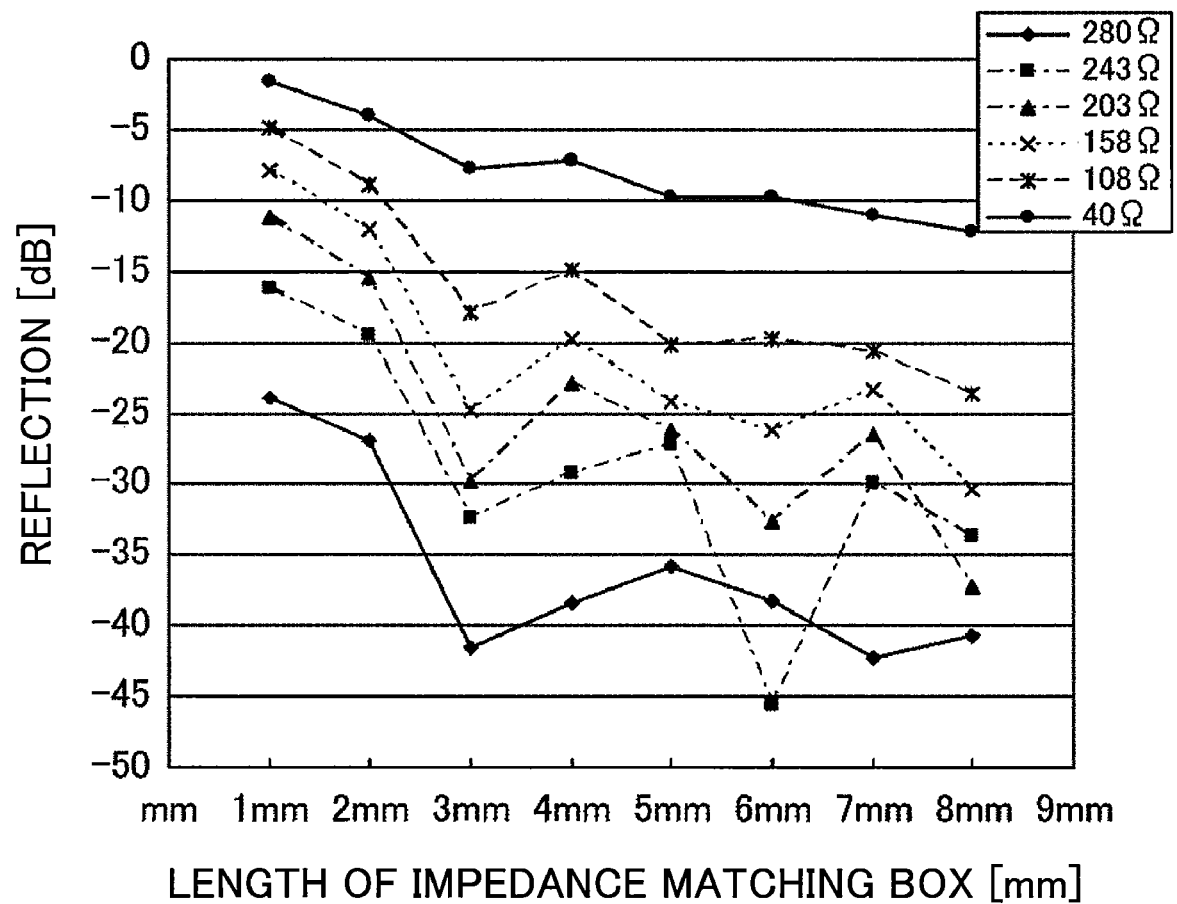
FIG. 17 is a diagram showing a reflection loss of a tapered impedance transducer of a metal waveguide.
Figure 18:
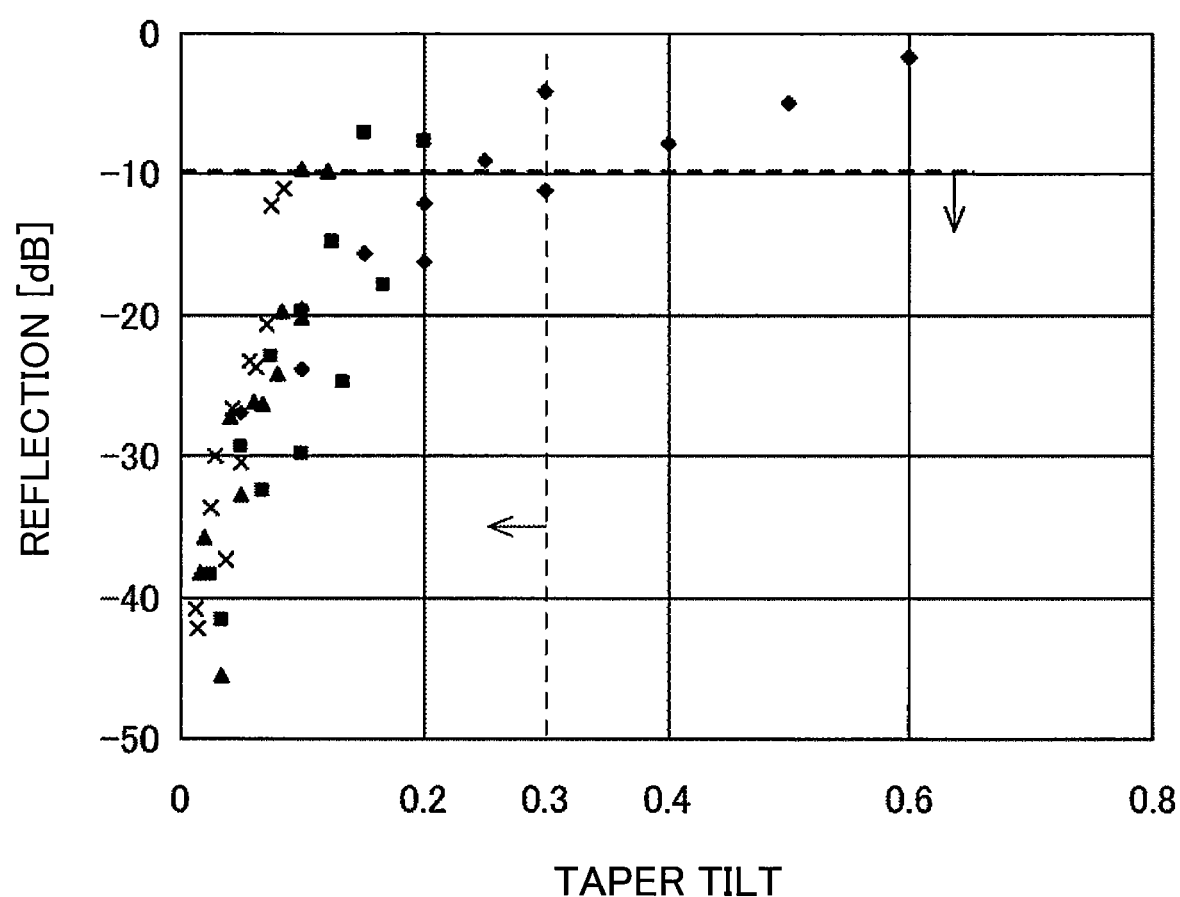
FIG. 18 is a diagram showing the reflective characteristics of FIG. 17 normalized by the taper angle of an impedance transducer.
Figure 19:
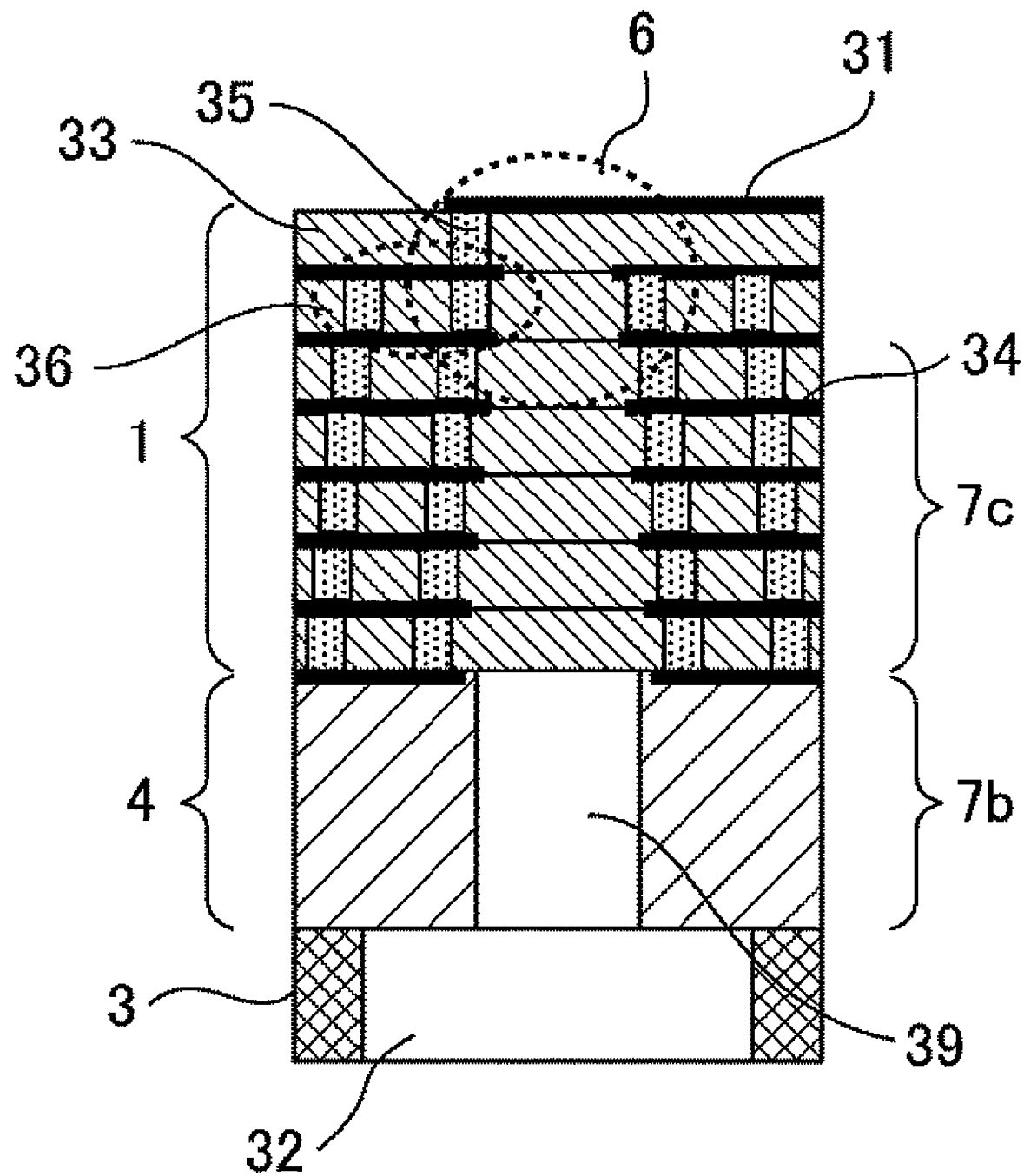
FIG. 19 is a vertical cross-section of a line transducer portion of a microstrip line and a waveguide in a millimeter waveband transceiver, according to a ninth embodiment.

FIG. 17 to FIG. 19 show a ninth embodiment of the line transducer portion between the microstrip line and the waveguide according to the invention This embodiment, by combining a tapered impedance matching box with the line transducer portion, increases the width of the passband.

FIG. 17 shows the reflection loss of a tapered impedance transducer of a metal waveguide. The horizontal axis shows the line length of the tapered impedance transducer, and the vertical axis shows the reflection loss of the impedance transducer. The characteristic impedance of the tapered impedance transducer input terminal opening cross-section is swept from $40\Omega$ to $280\Omega$. The characteristic impedance of the output terminal opening cross-section is assumed to be $380\Omega$. It is seen that, compared with the reflective characteristics of the line transducer using the $\lambda/4$ matching box shown in FIG. 13, the length of the matching box to obtain the desired reflection loss is considerably longer for the tapered transducer. It is also seen than when using a tapered transducer, reflection loss can be suppressed by increasing the characteristic impedance of the input terminal opening and the transducer line is made long to about 6 mm.

FIG. 18 shows the reflective characteristics in FIG. 17 normalized by the taper angle of the impedance transducer. The taper angle of the horizontal axis=(the difference of the length of the short side of the input/output waveguide cross-section)/(the length of the tapered impedance transducer). It is seen that when the angle is 0.1 (angle $5.7°=\tan^{-1}(0.1)$), the reflection loss is −20 dB or less which is satisfactory, but if the taper angle is changed to 0.3, the reflection loss worsens to −10 dB. When the impedance transducer is designed to have an angle of 0.1 or less (the input/output terminal impedance ratio of the impedance transducer is about 1.5), the reflection loss is about −15 dB or less, and it is seen that provided the angle is 0.3 or less (input/output terminal impedance ratio of the impedance transducer is about 2), the reflection loss is about −11 dB or less, which is a usable value.

FIG. 19 is a vertical cross-section of the ninth embodiment of the line transducer portion of the microstrip line and the waveguide in the millimeter waveband transceiver using a tapered impedance transducer. According to this embodiment, the millimeter waveband transceiver includes at least a multilayer substrate, an RF circuit, an antenna, a $\lambda/4$ matching box, an vertical transducer, an RF circuit control board, a heat transfer plate and an antenna holding plate. An impedance matching box such as a $\lambda/4$ matching box having a characteristic impedance ratio of 3 or less at the input/output terminals, is provided in at least two of the multilayer substrate, heat transfer plate, and antenna holding plate. According to this embodiment, instead of this impedance matching box, an impedance matching box including a tapered artificial-waveguide having a length of $\lambda/4$ or less with a taper angle satisfying the relation $\tan(\theta)/(\sqrt{(Er)})<0.3$, which has a reflection characteristic of −10 dB or less, is used in the multilayer substrate.

Specifically, the vertical transducer 6 having a ridged waveguide section 36 of low impedance and a tapered impedance matching box 7c, are provided in the multilayer substrate 1. Numeral 33 is a dielectric substrate for forming the microstrip line, and its thickness is MSLts. The $\lambda/4$ matching box 7b having a lower impedance than that of the standard waveguide 32 and a higher impedance than that of the tapered impedance matching box 7c, is provided in the heat transfer plate 4. Numeral 39 is a $\lambda/4$ matching box wherein the $\lambda/4$ matching box 7b is filled with a dielectric material of different dielectric constant from that used in the multilayer substrate 1.

In the tapered impedance matching box 7c provided in the multilayer substrate 1 having a dielectric constant Er, the line length is compressed by $\sqrt{Er}$, and the taper angle is enlarged by $\sqrt{Er}$ times. As shown in FIG. 19, by shifting the position of the via disposed in the multilayer substrate from the ridged waveguide section 36 to the waveguide 39, and shifting the via position within a range equal to or less than a dielectric single layer thickness $h*\sqrt{(Er)}*0.1$, the wideband tapered impedance matching box 7c having a reflection loss of −15 dB or less, can be manufactured. Moreover, even if the length of the tapered impedance matching box is not exactly $\lambda/4$, good electrical characteristics can still be obtained, and even if there is a dielectric constant fluctuation or thickness error in the multilayer substrate, the fluctuation of electrical characteristics may be expected to be small.

According to this embodiment, in the line conversion between the microstrip line and the waveguide, the loss which arises during transmission mode conversion between the TEM waves of the microstrip line and the waveguide TM01 waves is reduced by interposing an vertical transducer having a ridged waveguide section of lower impedance than that of the microstrip line, and the width of the passband is increased.

Tenth Embodiment

Figure 20:
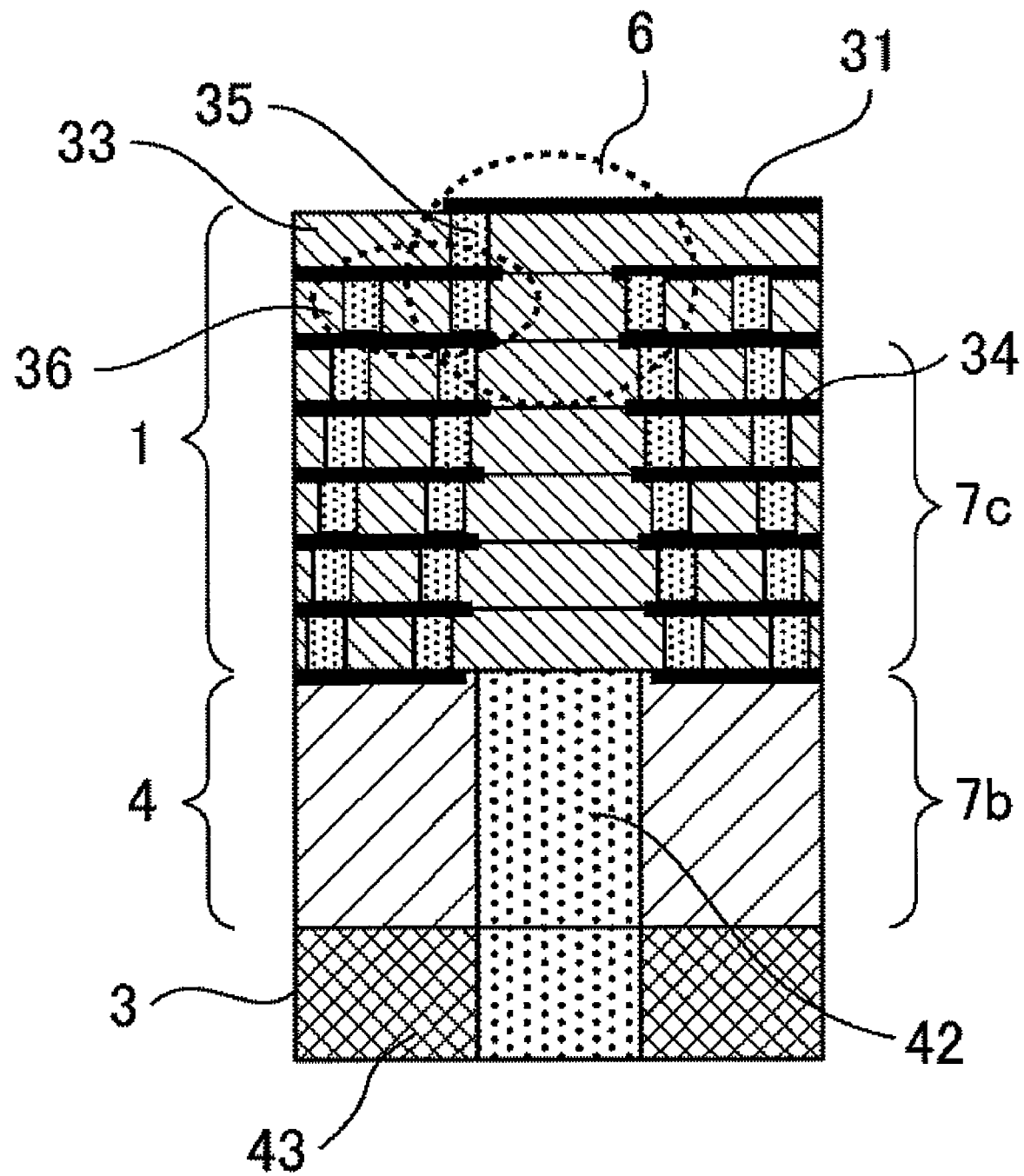
FIG. 20 is a vertical cross-section of a line transducer portion of a microstrip line and a waveguide in a millimeter waveband transceiver, according to a tenth embodiment.

FIG. 20 is a vertical cross-section showing an example of a line transducer portion of the microstrip line and waveguide in the millimeter waveband transceiver using a tapered impedance transducer. The vertical transducer 6 and tapered impedance matching box 7c having the ridged waveguide section 36 of low impedance are provided in the multilayer substrate 1. The λ/4 matching box 7b having a lower impedance than that of the standard waveguide 32 and higher impedance than that of the tapered impedance matching box 7c is provided in the heat transfer plate 4. 39 is a λ/4 matching box wherein the λ/4 matching box 7b is filled with a dielectric material having a different dielectric constant from that used in the multilayer substrate 1.

Numeral 42 is a waveguide of the λ/4 matching box 7b filled with a dielectric material different from air. Numeral 43 is a waveguide which constitutes the input/output terminals of the antenna 3, and it is filled with a dielectric material different from air. By filling the interior of the waveguides 42, 43 with a dielectric material, the characteristic impedance of the waveguides 42, 43 is reduced. If the impedance of the waveguide 43 of the antenna 3 is made small, the impedance ratio with the microstrip line 31 is suppressed, and if the impedance ratio is 3 or less, an assembly which satisfies the loss specification of the transceiver can be achieved with one λ/4 matching box 7.

Therefore, the thickness of the millimeter waveband transceiver 100 can be reduced, and it is possible to achieve lightweightness and low-cost by making the millimeter waveband transceiver 100 even more compact.

Eleventh Embodiment

Figure 21:
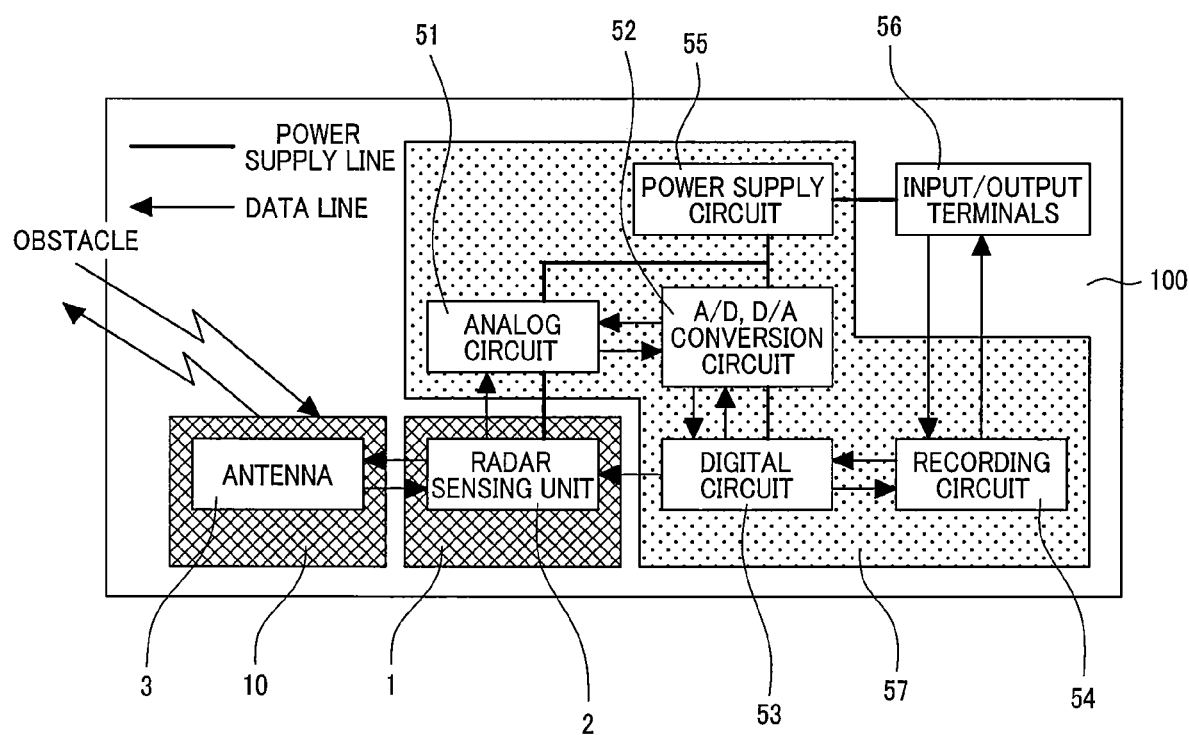
FIG. 21 is a block diagram showing an example wherein a millimeter waveband transceiver is applied to a radar as an eleventh embodiment of the invention.

FIG. 21 is a block diagram showing an example where the millimeter waveband transceiver of the invention is applied to a radar. The millimeter waveband transceiver 100 in a radar broadly includes the multilayer substrate 1, the antenna holding plate 10, a RF circuit control board 57, and an input/output terminals 56. The RF circuit 2 which functions as a radar sensing unit is formed in the multilayer substrate 1. The RF circuit control board 57 includes an analog circuit 51, an analog circuit 51, an A/D transducer circuit 52, a recording circuit 54, and a power supply circuit 55. In the example of FIG. 3, the A/D conversion circuit 52 is included in the RF circuit 2, and the analog circuit 51 and digital circuit 53 are included in the baseband circuit section 200. In the millimeter waveband transceiver 100 used for a radar, in order to perform radar detection of an obstacle, the digital circuit 53 starts the CPU and DSP, executes computational processing of various data in a predetermined sequence according to an operating program recorded in the recording circuit 54, and drives the radar sensing section of the RF circuit 2 by the analog circuit 51 via the DA/AD conversion circuit 52. The millimeter waveband transceiver 100 of this embodiment includes the antenna 3, vertical transducers 6, λ/4 matching boxes 7a, 7b, the standard waveguide 32, and the ridged waveguide section 36 of low impedance. The RF circuit 2 and transceiver antenna are respectively connected via vertical transducers.

The RF circuit 2 generates an intermediate frequency IF signal including a Doppler signal via the antenna 3, and this IF signal is transmitted to the analog circuit 51. The IF signal is amplified to some extent and rectified by the analog circuit 51, sampled by the A/D circuit 52, and processed by the digital circuit 53. The digital circuit 53, according to the program in the recording circuit 54, calculates the relative speed, relative distance and relative angle of an object from the reflected wave. These calculation results are recorded in the recording circuit 54, and transmitted to the outside from the input/output circuit 56.

According to this embodiment, in the line conversion between the microstrip line and the waveguide, the loss which arises during transmission mode conversion between TEM waves of the microstrip line and waveguide TM01 waves is reduced by interposing an vertical transducer having a ridged waveguide section of lower impedance than that of the microstrip line. Also, by using a spatial radiation suppression metal conductor pattern, radiated loss can be reduced, and a millimeter waveband transceiver with a wider communications passband can be manufactured.

Twelfth Embodiment

Figure 22:
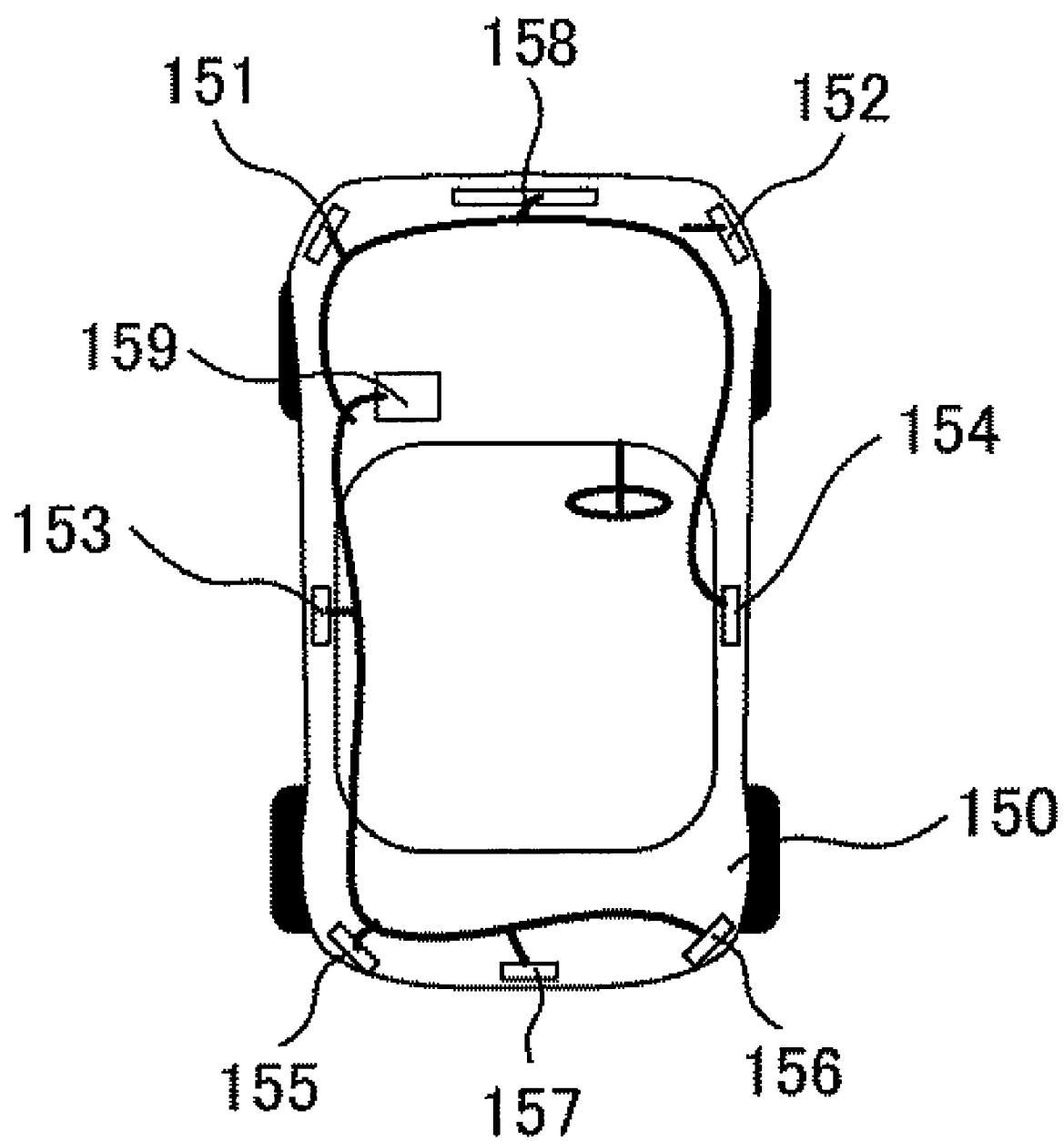
FIG. 22 is a diagram showing a twelfth embodiment wherein the invention is applied to a vehicle-mounted radar.

FIG. 22 shows an example wherein the millimeter waveband transceiver of this invention is applied to a vehicle-mounted radar. FIG. 22 shows a vehicle 150 on which the radar is mounted.

The vehicle 150 has a radar to which plural millimeter waveband transceivers 100 according to the embodiments of invention are applied, and a vehicle travel control system including an electronic circuit that processes electrical signals from the millimeter waveband transceivers 100 to generate control information, an electronic circuit that calculates vehicle speed, travel distance and acceleration from information about the rotation speed of the vehicle wheels, an electronic circuit that calculates an acceleration from a three-axle acceleration sensor and a vehicle rotation speed, a driving device mounted on the vehicle, a braking device, and an electronic device that calculates various information about the vehicle running state from electrical signals obtained by sensors that detect the vehicle state based on predetermined parameters, and thereby controls the driving device and braking device.

The vehicle 150, in order to observe the surroundings of the vehicle, has plural radars including the millimeter waveband transceivers 100, and generates and processes signals in its RF circuit and baseband circuit.

The vehicle radar of the vehicle 150 includes a left front short-distance radar 151, a right front short-distance radar 152, a left side short distance radar 153, a right side short distance radar 154, a left oblique back short distance radar 155, a right oblique back short distance radar 156, a back short distance radar 157, and a front long-distance radar 158. A radar control unit 159 is also provided that monitors and controls all of these radars. In each radar, in the millimeter waveband transceiver 100 having a waveguide-shaped input/output antenna, the antenna 3 is separated from the multilayer substrate 1 in which the RF circuit 2 is formed. By passing through a waveguide connecting line, i.e., one of the line transducers portion of the microstrip line and waveguide already described in the embodiments of the invention, antennas having different azimuth angles can be connected. The RF circuit section and RF circuit control board can be shared even if the detection angle specification is different due to the vehicle mounting position, so the manufacturing cost of the radar can be decreased by mass production increases.

Also, by providing the heat radiation via 5, heat transfer plate 4 and antenna holding plate 10 which have a low heat resistance in the millimeter waveband transceiver 100, heat radiation channels can be ensured even if the radar is installed in a closed space where heat is liable to accumulate such as the bumpers, doors and side mirrors, the heat generated in the RF circuit 2 is transmitted to the outside, and stable operation is performed. Due to the stable operation of the millimeter waveband transceiver 100, since operating reliability with respect to environmental temperature is enhanced, a vehicle travel control system having excellent robustness to environmental changes can be obtained even if the plural millimeter waveband transceivers 100 are installed in the vehicle and electronic devices are provided that control their output.

With the vehicle radar system using plural millimeter waveband transceivers according to the present embodiment, a substantial improvement of S/N ratio can be expected due to reduction of assembly losses of the millimeter waveband transceivers, and as a result, the external environment of the vehicle can be appreciated more precisely. Under any driving conditions such as traffic congestion, turning and changing route, if the driver can be informed of the external situation more precisely and quickly, there is more chance of preventing a vehicle accident. By using the millimeter waveband transceiver in an inter-vehicle communication system, or as a signal send/receive system between the vehicle and a public communications network, a driver's driving pattern in an outside environment can be known, so safe driving indices can be derived statistically, the driver's vehicle insurance costs can be reduced, and object monitoring sensors for use with vehicles which allow an objective evaluation of accidents, can be provided.

Thirteenth Embodiment

Figure 23:
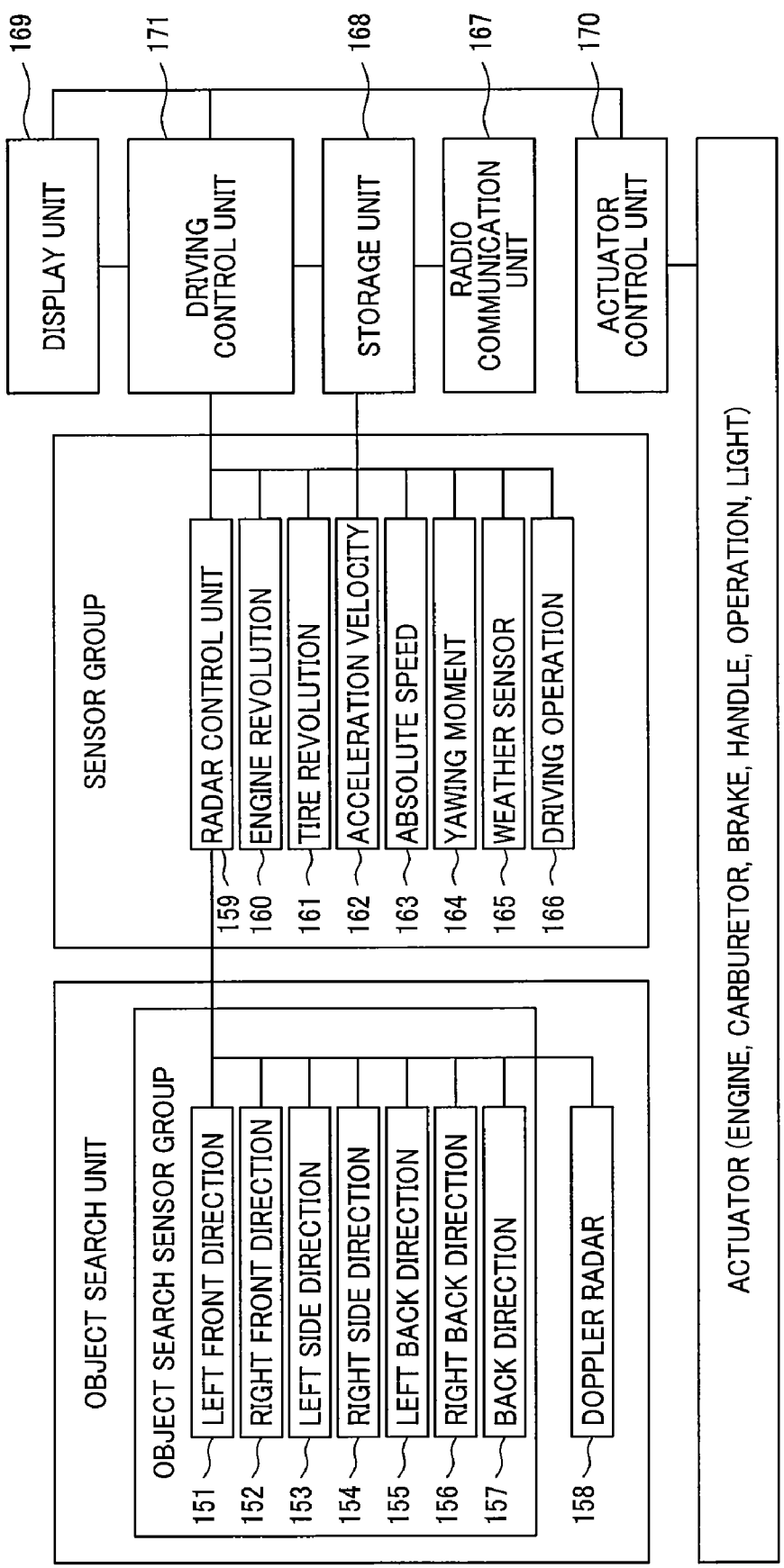
FIG. 23 is a diagram showing an example of a circuit layout of a vehicle control device wherein the millimeter waveband transceiver is applied to a vehicle-mounted radar as a thirteenth embodiment of the invention.
Figure 24:
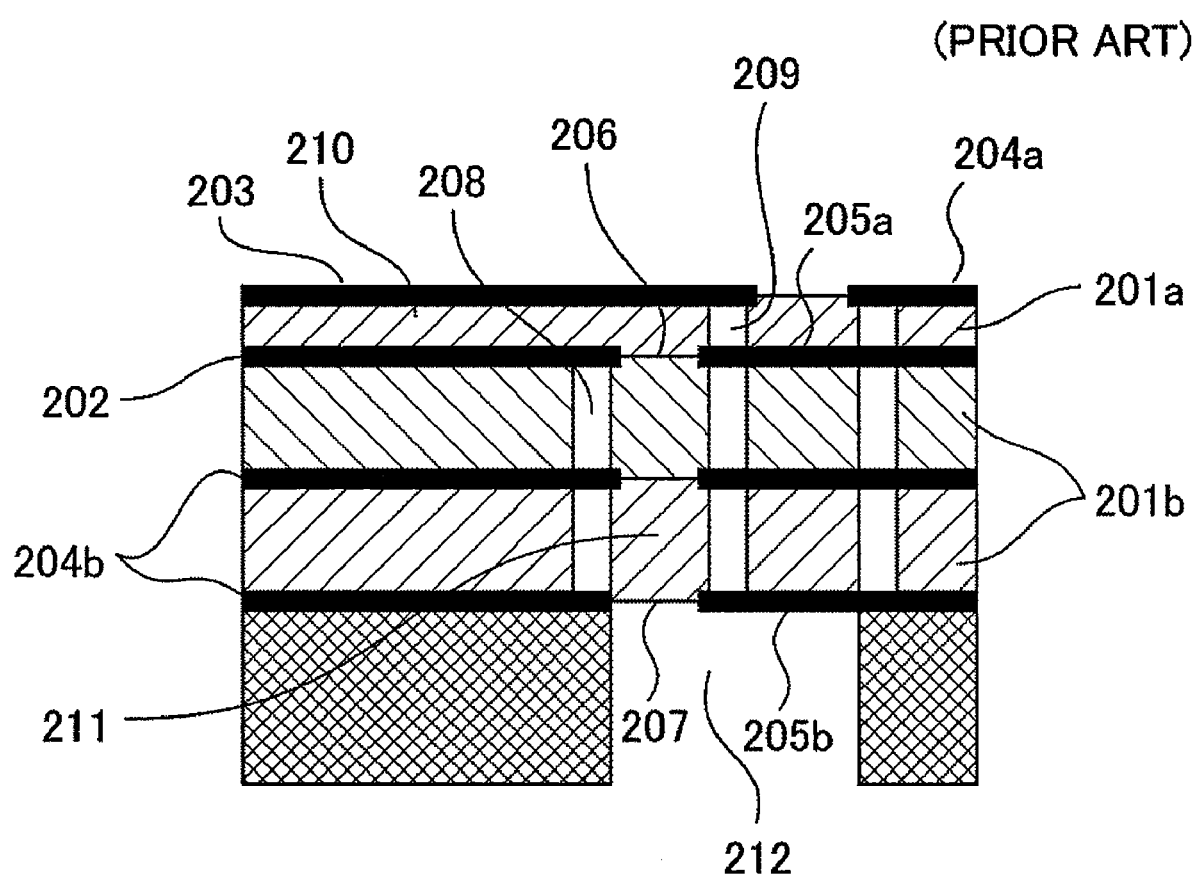
FIG. 24 is a diagram showing a first example of a waveguide/microstrip line transducer according to the conventional technology.
Figure 25:
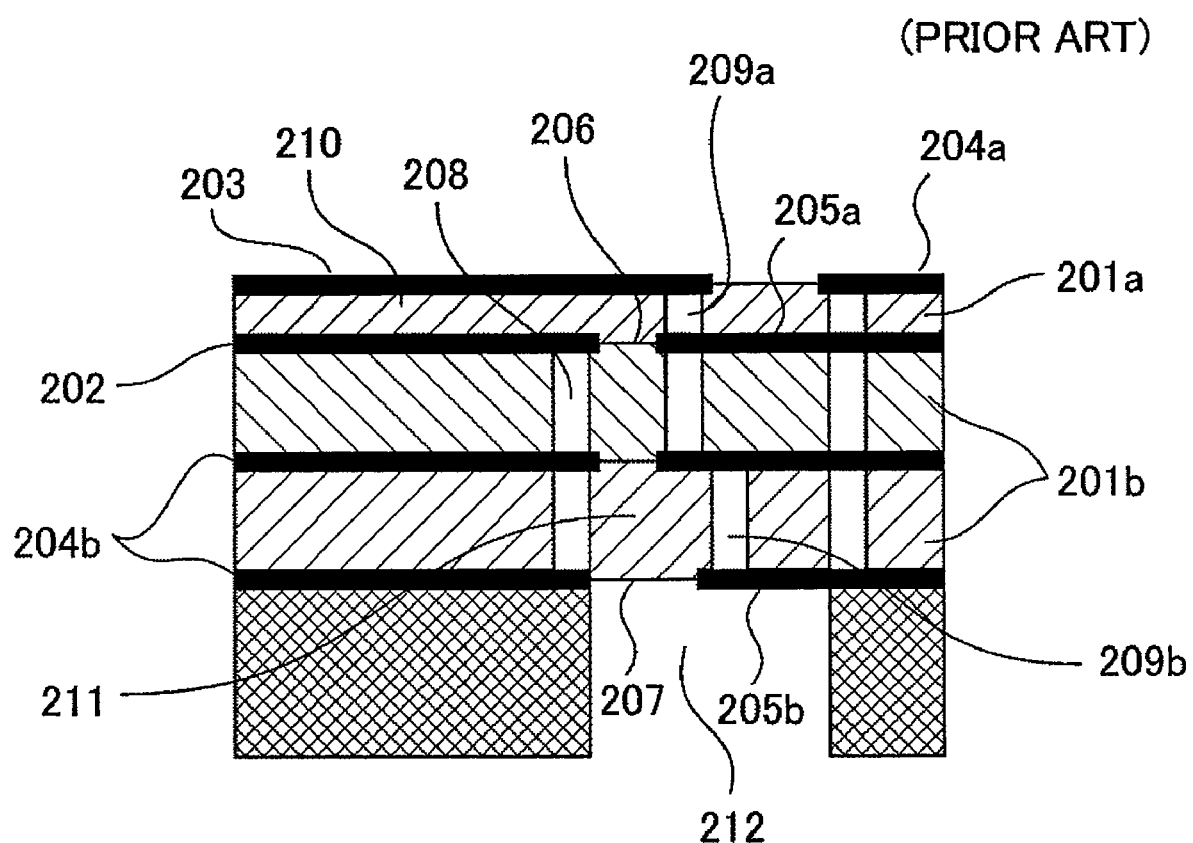
FIG. 25 is a diagram showing a second example of a waveguide/microstrip line transducer according to the conventional technology.

FIG. 23 shows a vehicle control circuit for a vehicle wherein the millimeter waveband transceiver of the invention is applied to a vehicle-mounted radar.

FIG. 23 is an example of the circuit construction in a vehicle controller 200 built into the vehicle 150. The vehicle controller 200, apart from the plural millimeter waveband transceivers (radar set) 151 to 158 for a radar, includes an engine rotation speed counter 160, a tire rotation speed counter 161, an acceleration sensor 162, a vehicle speed sensor 163, a rotation sensor 164, a temperature and humidity weather sensor 165, a control system sensor 166, a radio communications unit 167 including the millimeter waveband transceivers 100 that performs inter-vehicle communication and sends/receives signals between the vehicle and a public communications network, a storage unit 168, a display unit 169, an actuator control unit 170 that controls the engine and other devices, and a driving control unit 171 that integrates all the vehicle control units. By monitoring the surrounding environment and vehicle running state, monitoring the weather in detail by radar or by a group of sensors, and acquiring road traffic information such as traffic jams from the radio communications unit 167, the vehicle control unit continuously provides an optimum driving environment by controlling the vehicle via the actuator control unit 170. Since the vehicle driving state including the vehicle state and vehicle surrounding environment can be known at all times, accident analysis and vehicle insurance fee computations can easily be performed by tracing the situation in the storage unit.

Using the vehicle radar system of this embodiment, a substantial improvement of S/N ratio can be achieved by reducing assembly losses in the millimeter waveband transceiver, and as a result the vehicle's external environment can be known more precisely. If the driver can be given a large amount of information about his environment more precisely and quickly under any driving conditions such as traffic congestion, turning, changing route, etc., the chance of avoiding a vehicle accident is increased. By using the millimeter waveband transceiver in an inter-vehicle communication system, or as a signal send/receive system between the vehicle and a public communications network, a driver's driving pattern in an outside environment can be appreciated, safe driving indices can be derived statistically, the driver's vehicle insurance costs can be reduced, and object monitoring sensors for vehicles which allow an objective evaluation of accidents, can be provided.

What is claimed is:

1. A millimeter waveband transceiver comprising:
a microstrip line;
a standard waveguide; and
a transmission mode transducer provided between the microstrip line and the standard waveguide,
wherein the transmission mode transducer comprises a waveguide transducer,
wherein the waveguide transducer is a ridged waveguide, and
wherein a characteristic impedance of the ridged waveguide is equal to or less than a characteristic impedance of the microstrip line.

2. The millimeter waveband transceiver according to claim 1, wherein the ridged waveguide is a vertical transducer, and the microstrip line is connected to the ridged waveguide at a right angle.

3. The millimeter waveband transceiver according to claim 2, wherein a length of a short side of a cross-sectional opening of the ridged waveguide, which is parallel to a propagation direction of a millimeter waveband signal, is twice or more than twice a dielectric thickness of the microstrip line.

4. The millimeter waveband transceiver according to claim 2,
wherein a length of a short side of a rectangle cross-sectional opening of the ridged waveguide is twice or more than twice a dielectric thickness of the microstrip line, and
wherein the ridged waveguide has a ridge provided near a center of one or both of long sides of the ridged waveguide cross-section projecting toward the center of the rectangle, wherein a distance from a nearest part of the opening is twice or less than twice the thickness of the dielectric of the microstrip line.

5. The millimeter waveband transceiver according to claim 2,
wherein the ridged waveguide comprises a pair of ridges provided near the center of one or both long sides of a rectangle cross-section of the ridged waveguide, projecting toward the center of the rectangle, wherein a distance from a nearest part of the cross-sectional opening is twice or less than twice a thickness of a dielectric of the microstrip line,
wherein a width of one of the ridges is twice or less than twice a width of the microstrip line, and
wherein a width of the other ridge is twice or more than twice the width of the one ridge.

6. The millimeter waveband transceiver according to claim 1,
wherein a λ/4 matching box is connected between the transmission mode transducer and the standard waveguide, and
wherein a characteristic impedance of the λ/4 matching box is a higher impedance than the characteristic impedance of the ridged waveguide and the characteristic impedance of the microstrip line and is a lower impedance than a characteristic impedance of the standard waveguide.

7. The millimeter waveband transceiver according to claim 1,
wherein a multilayer substrate is laminated together with a heat transfer plate,
wherein a transmission mode transducer and a first λ/4 matching box are provided in the multilayer substrate, wherein a characteristic impedance of the first λ/4 matching box is a higher impedance than the characteristic impedance of the ridged waveguide and the characteristic impedance of the microstrip line and is a lower impedance than a characteristic impedance of the standard waveguide, and wherein a second λ/4 matching box, provided in the heat transfer plate, has a lower impedance than the characteristic impedance of the standard waveguide, and a higher impedance than the characteristic impedance of the first λ/4 matching box.

8. The millimeter waveband transceiver according to claim 7, wherein an opening shape of the first λ/4 matching box and an opening shape of the second λ/4 matching box have point symmetry and are non-analogous.

9. The millimeter waveband transceiver according to claim 2, wherein a metal conductor pattern wider than the microstrip line is provided near an edge of a metal conductor which is the opposite GND electrode of the microstrip line immediately prior to connecting to the ridged waveguide having a smaller characteristic impedance than that of the microstrip line.

10. The millimeter waveband transceiver according to claim 7, wherein the first λ/4 matching box is a tapered impedance matching box provided in the multilayer substrate.

11. The millimeter waveband transceiver according to claim 1, the transceiver further comprising:
an RF circuit, an antenna, wherein the standard waveguide constitutes input and output terminals of the antenna, wherein the microstrip line is a millimeter waveband data line of the RF circuit, and a λ/4 matching box is connected between the standard waveguide and the ridged waveguide,
wherein a characteristic impedance of the λ/4 matching box is an intermediate value between the characteristic impedance of the microstrip line and a characteristic impedance of the standard waveguide.

12. The millimeter waveband transceiver according to claim 1, the transceiver further comprising:
a multilayer substrate;
an RF circuit control board;
the RF circuit provided on the top layer of the RF circuit control board and the multilayer substrate;
an antenna connected to an undersurface of the multilayer substrate; and
the waveguide transducer and a λ/4 matching box of the transmission mode transducer being provided in an inner layer of the multilayer substrate,
wherein the ridged waveguide of the waveguide transducer and the λ/4 matching box are formed in a waveguide shape through to the underlayer surface of the multilayer substrate by alternately laminating a dielectric film and a metal conductor film, forming a cutout pattern of the metal conductor film, and electrically connecting the metal conductor films by vias.

13. The millimeter waveband transceiver according to claim 2,
wherein the vertical transducer comprising the ridged waveguide has a ridge projecting near a center of one or both long sides of a waveguide cross-section, and has a smaller characteristic impedance than that of the microstrip line,
wherein the ridged waveguide is formed in a multilayer substrate wherein a dielectric film and a metal film are alternately laminated, wherein a length of the projecting ridge is λ/4 or less from a facet of one of said long sides of the rectangular ridged waveguide opening, and
wherein a plurality of vias for making electrical connection are disposed in the projection direction in the multilayer substrate.

14. The millimeter waveband transceiver according to claim 1, the transceiver further comprising:
a multilayer substrate;
an antenna connected to an undersurface of the multilayer substrate; and
a standard waveguide which constitutes input and output terminals of the antenna,
wherein the microstrip line is a millimeter waveband data line provided on a top surface of the multilayer substrate, the waveguide transducer having the ridged waveguide and a first λ/4 matching box of the transmission mode transducer are provided in an inner layer of the multilayer substrate, a heat transfer plate, and an antenna holding plate,
wherein a characteristic impedance of the first λ/4 matching box is an intermediate value between the characteristic impedance of the microstrip line and a characteristic impedance of the standard waveguide,
a plurality of second λ/4 matching boxes having a characteristic impedance ratio at the input and output terminals of 3 or less are provided in at least one of the multilayer substrate, the heat transfer plate, and the antenna holding plate; and
wherein the first λ/4 matching box is connected to the standard waveguide by the second λ/4 matching box.

15. A vehicle radar, comprising a millimeter waveband transceiver with a radar function comprising:
an RF circuit;
a plurality of antennas;
a standard waveguide which constitutes respective input and output terminals of the antennas; and
a transmission mode transducer connected respectively between the RF circuit and standard waveguides,
wherein the transmission mode transducer is a vertical transducer that connects a microstrip line of the RF circuit to a ridged waveguide thereof at a right angle, and
wherein a characteristic impedance of the ridged waveguide is equal to or less than a characteristic impedance of the microstrip line.

16. The vehicle radar according to claim 15,
wherein the RF circuit and the antennas are superimposed on each other with a heat transfer plate sandwiched therebetween, and
wherein a connection line is formed by the vertical transducer and a λ/4 matching box.

17. The vehicle radar according to claim 15, further comprising:
a first λ/4 matching box connected between the standard waveguide and the transmission mode transducer;
a multilayer substrate;
a heat transfer plate; and
an antenna holding plate,
wherein a characteristic impedance of the first λ/4 matching box is an intermediate value between the characteristic impedances of the microstrip line and the standard waveguide,
a plurality of second λ/4 matching boxes having a characteristic impedance at the input and output terminals of 3 or less are provided in at least one of the multilayer substrate, the heat transfer plate, and the antenna holding plate, and wherein the first λ/4 matching box and the standard waveguide are connected by the second λ/4 matching box.

18. A vehicle comprising:

a millimeter waveband transceiver mounted on the vehicle, the vehicle having a radar function; and an electronic circuit that controls the vehicle based on information from the millimeter waveband transceiver, wherein the millimeter waveband transceiver comprises an RF circuit, a plurality of antennas, a standard waveguide which constitutes input and output terminals of the plurality of antennas, and a transmission mode transducer connected respectively between the RF circuit and standard waveguides, wherein the transmission mode transducer is a vertical transducer that connects the microstrip line of the RF circuit to a ridged waveguide at a right angle, and wherein a characteristic impedance of the ridged waveguide is equal to or less than a characteristic impedance of the microstrip line.

19. The vehicle according to claim 18, wherein the RF circuit and plurality of antennas are superimposed on each other with a heat transfer plate sandwiched therebetween, and wherein the RF circuit and antenna connection lines are formed by the vertical transducer and a λ/4 matching box.

20. The vehicle according to claim 19, wherein the RF circuit and the λ/4 matching box are formed by a multilayer substrate, and wherein the multilayer substrate is attached to one side of the antenna holding plate via the heat transfer plate, and the plurality of antennas are attached to the other side of the antenna holding plate.

* * * * *